US012374533B2

(12) United States Patent
Matsuura

(10) Patent No.: US 12,374,533 B2
(45) Date of Patent: Jul. 29, 2025

(54) PLASMA PROCESSING SYSTEM AND METHOD OF MOUNTING ANNULAR MEMBER

(71) Applicant: Tokyo Electron Limited, Tokyo (JP)

(72) Inventor: Shin Matsuura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 619 days.

(21) Appl. No.: 17/701,673

(22) Filed: Mar. 23, 2022

(65) Prior Publication Data

US 2022/0310366 A1 Sep. 29, 2022

(30) Foreign Application Priority Data

Mar. 24, 2021 (JP) ................ 2021-050472

(51) Int. Cl.
*H01J 37/32* (2006.01)
*H01L 21/67* (2006.01)
*H01L 21/683* (2006.01)
*H01L 21/687* (2006.01)

(52) U.S. Cl.
CPC .. *H01J 37/32724* (2013.01); *H01J 37/32642* (2013.01); *H01L 21/67109* (2013.01); *H01L 21/6831* (2013.01); *H01L 21/68735* (2013.01); *H01L 21/68742* (2013.01)

(58) Field of Classification Search
CPC ............ C23C 16/4405; C23C 16/4585; C23C 16/4586; H01J 37/32642; H01J 37/32724; H01J 37/32862; H01L 21/67109; H01L 21/6831; H01L 21/68735; H01L 21/68742
See application file for complete search history.

(56) References Cited

U.S. PATENT DOCUMENTS

| | | | |
|---|---|---|---|
| 2005/0205209 A1* | 9/2005 | Mosden | H01L 21/67069 156/345.31 |
| 2011/0031111 A1* | 2/2011 | Kobayashi | H01J 37/32623 204/298.36 |
| 2012/0247671 A1* | 10/2012 | Sugawara | H01J 37/32642 156/345.31 |
| 2013/0186858 A1* | 7/2013 | Suzuki | H01L 21/68757 156/345.34 |
| 2020/0234981 A1* | 7/2020 | Schmid | H01L 21/68785 |
| 2020/0303233 A1* | 9/2020 | Lee | H01L 21/68757 |

FOREIGN PATENT DOCUMENTS

JP 2011-54933 A 3/2011

* cited by examiner

*Primary Examiner* — Benjamin Kendall
(74) *Attorney, Agent, or Firm* — XSENSUS LLP

(57) ABSTRACT

A plasma processing system is provided. The system comprises a plasma processing apparatus, a transfer apparatus connected to the plasma processing apparatus, and a controler. The plasma processing apparatus includes a substrate support including a support unit for a substrate as well as an annular member disposed to surround the substrate. The substrate support includes a plurality of insertion holes passing through the support unit, lifters to elevate/lower the annular member through the insertion holes and a temperature adjustment mechanism for adjusting a temperature of the support unit. The transfer apparatus includes a transfer mechanism for transferring the annular member to the substrate support. The annual member has includes concave portions in its bottom surface, into which upper end the lifters are fitted.

18 Claims, 12 Drawing Sheets

PLASMA PROCESSING SYSTEM AND METHOD OF MOUNTING ANNULAR MEMBER

CROSS-REFERENCE TO RELATED APPLICATION

This application claims priority to Japanese Patent Application No. 2021-050472 filed on Mar. 24, 2021, the entire contents of which are incorporated herein by reference.

TECHNICAL FIELD

The present disclosure relates to a plasma processing system and a method of mounting an annular member.

BACKGROUND

Japanese Laid-open Patent Publication No. 2011-54933 discloses a substrate processing apparatus in which a substrate is disposed in a processing chamber, a focus ring is disposed to surround a periphery of the substrate, and plasma processing is performed on the substrate. The substrate processing apparatus includes a mounting table including a susceptor having a substrate mounting surface on which the substrate is mounted and a focus ring mounting surface on which the focus ring is mounted, and a plurality of positioning pins. The positioning pin is formed in a pin shape using a material heated to expand in a radial direction thereof, is mounted to protrude from a lower surface of the focus ring, is inserted into a positioning hole formed in the focus ring mounting surface of the susceptor, is heated to expand in a radial direction thereof, and is fitted into the positioning hole, thereby positioning the focus ring. In addition, the substrate processing apparatus disclosed in Japanese Laid-open Patent Publication No. 2011-54933 includes a lifter pin and a transfer arm. The lifter pin is provided on the mounting table so as to be protruded above or be retracted from the focus ring mounting surface, thereby lifting each positioning pin to separate the focus ring from the focus ring mounting surface. The transfer arm is provided outside the processing chamber and exchanges the focus ring with the lifter pin in a state, in which the positioning pin is mounted, through a carry-in/out port provided in the processing chamber.

SUMMARY

In the technique according to the present disclosure, by using a transfer device, when an annular member is mounted on a substrate support, the annular member is properly positioned with respect to the substrate support.

In accordance with an aspect of the present disclosure, there is provided a plasma processing system comprising: a plasma processing apparatus configured to perform plasma processing on a substrate; a transfer apparatus connected to the plasma processing apparatus; and a controler. The plasma processing apparatus includes a substrate support which includes a support unit having a substrate mounting surface on which the substrate is mounted and an annular member mounting surface on which an annular member disposed to surround the substrate is mounted. The substrate support includes a plurality of insertion holes which pass through the annular member mounting surface and are formed in the support unit, lifters which are provided in the insertion holes and are elevated to protrude from the annular member mounting surface, an elevating mechanism which elevates the lifters, and a temperature adjustment mechanism which adjusts a temperature of the support unit. The transfer apparatus includes a transfer mechanism configured to transfer the annular member to the substrate support. Concave portions, into which upper end portions of the lifters are fitted, are formed in a bottom surface of the annular member so as to be recessed upward. The controler controls the elevating mechanism, the temperature adjustment mechanism, and the transfer mechanism to perform a process of adjusting the temperature of the support unit to a preset temperature at which a position of each of the concave portions of the annular member matches positions of the corresponding lifter and insertion hole and a process of transferring the annular member above the support unit, receiving the annular member with the lifter protruding from the annular member mounting surface of the support unit of which the temperature is adjusted to the preset temperature, and mounting the annular member on the annular member mounting surface.

DETAILED DESCRIPTION

Figure 1:
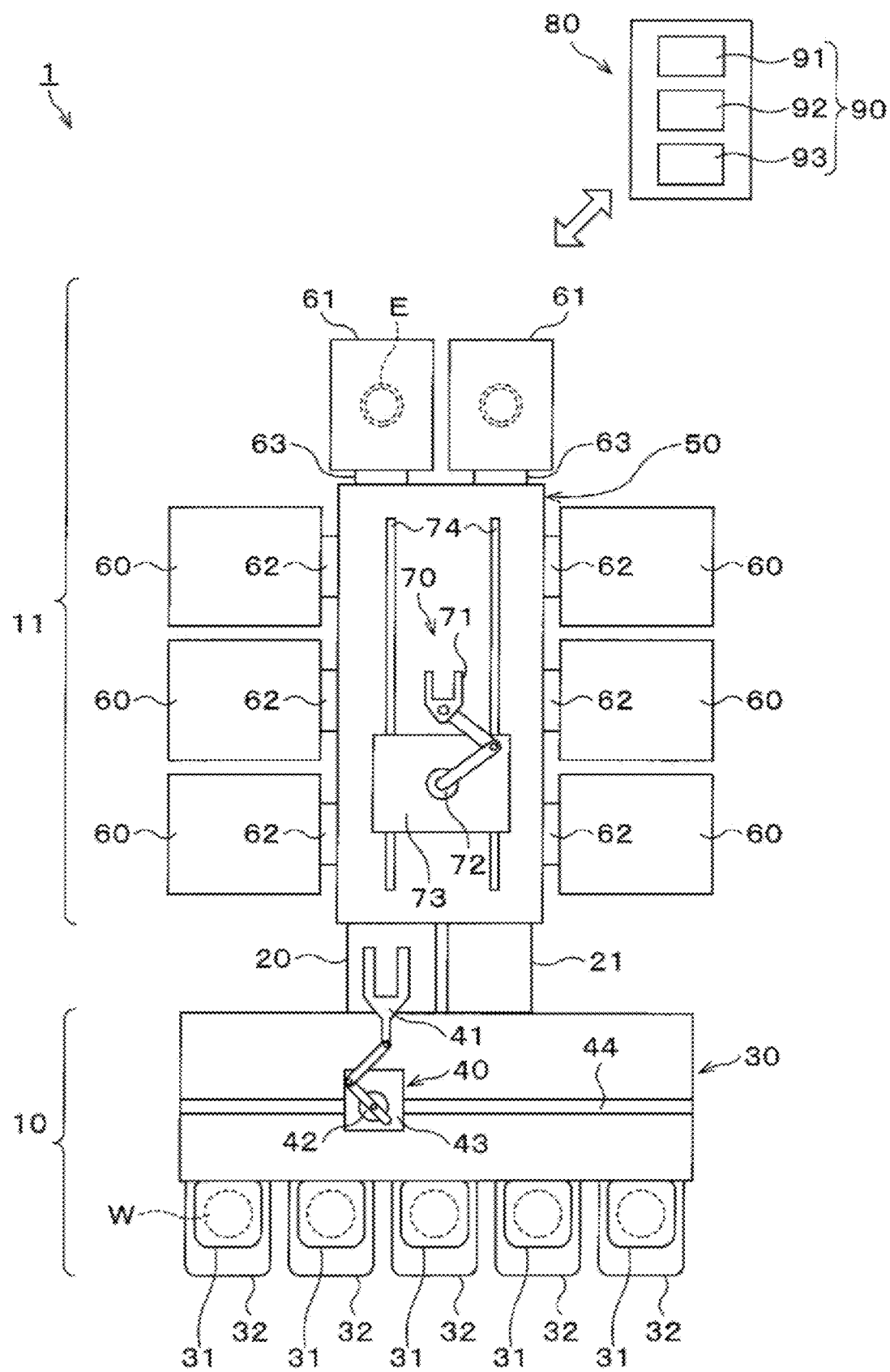
FIG. 1 is a plan view illustrating an outline of a configuration of a plasma processing system according to a first embodiment.

In a process of manufacturing a semiconductor device or the like, a substrate such as a semiconductor wafer (hereinafter, referred to as "wafer") is subjected to plasma processing such as etching using plasma. The plasma processing is performed in a state in which the substrate is mounted on a substrate support in a processing chamber.

In addition, during plasma processing, an annular member disposed to surround the substrate on the substrate support may be used. For example, in order to obtain an excellent and uniform plasma processing result at a central portion and a peripheral portion of the substrate, as the annular member, an edge ring disposed adjacent to the substrate may be used.

When the edge ring is used, in order to obtain a uniform processing result in a circumferential direction at the peripheral portion of the substrate, it is necessary to accurately position and mount the edge ring with high precision with respect to the substrate support. For example, in Japanese Laid-open Patent Publication No. 2011-54933, the edge ring is positioned using a positioning pin which is mounted to protrude from a lower surface of an edge ring and is inserted into a positioning hole formed in a mounting surface of the edge ring.

In addition, the edge ring needs to be replaced because the edge ring is etched by being exposed to plasma. When the edge ring is worn out, the edge ring is generally replaced by an operator, but replacing the edge ring using a transfer device is also taken into account.

Therefore, in a technique according to the present disclosure, by using a transfer device, when an annular member such as an edge ring is mounted on a substrate support, the annular member is appropriately positioned with respect to the substrate support.

Hereinafter, a plasma processing apparatus and a method of mounting an annular member (hereinafter, referred to as "ring") according to the present embodiment will be described with reference to the accompanying drawings. Moreover, in the present specification and the drawings, elements which have substantially the same function and configuration are assigned the same reference numerals, and overlapping descriptions thereof are omitted.

First Embodiment

<Plasma Processing System>

FIG. 1 is a plan view illustrating an outline of a configuration of a plasma processing system according to a first embodiment using plasma.

In a plasma processing system 1 of FIG. 1, a wafer W as a substrate is subjected to plasma processing such as etching.

As shown in FIG. 1, the plasma processing system 1 includes an atmospheric unit 10 and a decompression unit 11, and the atmospheric unit 10 and the decompression unit 11 are integrally connected through load lock modules 20 and 21. The atmospheric unit 10 includes an atmospheric module which performs desired processing on the wafer W in an atmospheric pressure atmosphere. The decompression unit 11 includes a processing module 60 which performs desired processing on the wafer W in a depressurized atmosphere (vacuum atmosphere).

The load lock modules 20 and 21 are provided to connect a loader module 30 included in the atmospheric unit 10 and a transfer module 50 included in the decompression unit 11 through gate valves (not shown). The load lock modules 20 and 21 are configured to temporarily hold the wafer W. Furthermore, the load lock modules 20 and 21 are provided such that the inside thereof may be converted between an atmospheric pressure atmosphere and a reduced-pressure atmosphere.

The atmospheric unit 10 includes the loader module 30 provided with a transfer mechanism 40 to be described below and a load port 32 on which a front opening unified pod (FOUP) 31 is mounted. The FOUP 31 may store a plurality of wafers W. In addition, the loader module 30 may be connected to an orienter module (not shown) for adjusting a horizontal orientation of the wafer W, a buffer module (not shown) for temporarily storing the plurality of wafers W, and the like.

The loader module 30 includes a rectangular housing in a plan view, and the inside of the housing is maintained in an atmospheric pressure atmosphere. A plurality of load ports 32, for example, five load ports 32 are provided side by side on one side surface forming a long side of the housing of the loader module 30. The load lock modules 20 and 21 are provided side by side on the other side surface forming a long side of the housing of the loader module 30.

The transfer mechanism 40 capable of transferring the wafer W is provided inside the housing of the loader module 30. The transfer mechanism 40 includes a transfer arm 41 which supports the wafer W during a transfer thereof, a rotary table 42 which rotatably supports the transfer arm 41, and a base 43 on which the rotary table 42 is mounted. In addition, a guide rail 44 extending in a longitudinal direction of the loader module 30 is provided inside the loader module 30. The base 43 is provided on the guide rail 44, and the transfer mechanism 40 is provided to be movable along the guide rail 44.

The decompression unit 11 includes the transfer module 50 as a transfer apparatus which transfers the wafer W and an edge ring E, the processing module 60 as a plasma processing device which performs desired plasma processing on the wafer W transferred from the transfer module 50, and an accommodation module 61 which accommodates the edge ring E. The insides of the transfer module 50 and the processing module 60 (specifically, the insides of a decompression transfer chamber 51 and a plasma processing chamber 100 which will be described below) are each maintained in a reduced-pressure atmosphere, and the inside of the accommodation module 61 is also maintained in a reduced-pressure atmosphere. With respect to one transfer module 50, a plurality of processing modules 60, for example, six processing modules 60, are provided, and a plurality of accommodation modules 61, for example, two accommodation modules 61, are also provided. In addition, the number and arrangement of the processing modules 60 are not limited to the present embodiment and may be arbitrarily set, and at least one processing module required to mount the edge ring E may be provided. In addition, the number and arrangement of the accommodation modules 61 are not limited to the present embodiment and may be arbitrarily set, and for example, at least one accommodation module 61 may be provided.

The transfer module 50 includes the decompression transfer chamber 51 which includes a housing having a polygonal shape in a plan view (quadrangular shape in a plan view in the illustrated example), and the decompression transfer chamber 51 is connected to the load lock modules 20 and 21. The transfer module 50 transfers the wafer W loaded into the load lock module 20 to one processing module 60 and carries the wafer W subjected to desired plasma processing in the processing module 60 out to the atmospheric unit 10 through the load lock module 21. In addition, the transfer module 50 transfers the edge ring E in the accommodation module 61 to one processing module 60. In addition, in some cases, the transfer module 50 transfers the edge ring E in the processing module 60 to the accommodation module 61.

The processing module 60 performs plasma processing such as etching on the wafer W. In addition, the processing module 60 is connected to the transfer module 50 through a gate valve 62. In addition, the detailed configuration of the processing module 60 will be described below.

The accommodation module 61 accommodates the edge ring E. In addition, the accommodation module 61 is connected to the transfer module 50 through a gate valve 63.

A transfer mechanism 70 capable of transferring the wafer W and the edge ring E is provided inside the decompression transfer chamber 51 of the transfer module 50. Similarly to the transfer mechanism 40, the transfer mechanism 70 includes a transfer arm 71 as a transfer support which supports the wafer W and the edge ring E during a transfer thereof, a rotary table 72 which rotatably supports the transfer arm 71, and a base 73 on which the rotary table 72 is mounted. In addition, a guide rail 74 extending in a longitudinal direction of the transfer module 50 is provided inside the decompression transfer chamber 51 of the transfer module 50. The base 73 is provided on the guide rail 74, and the transfer mechanism 70 is provided to be movable along the guide rail 74.

In the transfer module 50, the transfer arm 71 receives the wafer W held in the load lock module 20 and carries the water W into the processing module 60. In addition, the transfer arm 71 receives the wafer W held in the processing module 60 and carries the wafer W out to the load lock module 21.

Furthermore, in the transfer module 50, the transfer arm 71 receives the edge ring E in the accommodation module 61 and carries the edge ring E into the processing module 60. In addition, in some cases, the transfer arm 71 receives the edge ring E held in the processing module 60 and carries the edge ring E out to the accommodation module 61.

In addition, the plasma processing system 1 includes a controller 80. In one embodiment, the controller 80 processes computer-executable instructions that cause the plasma processing system 1 to perform various processes described in the present disclosure. The controller 80 may be configured to control each of other elements of the plasma processing system 1 to perform the various processes described herein. In one embodiment, a part or entirety of the controller 80 may be included in other elements of the plasma processing system 1. The controller 80 may include, for example, a computer 90. The computer 90 may include, for example, a central processing unit (CPU) 91, a memory unit 92, and a communication interface 93. The CPU 91 may be configured to perform various control operations based on programs stored in the memory unit 92. The memory unit 92 may include a random access memory (RAM), a read only memory (ROM), a hard disk drive (HDD), a solid state drive (SSD), or a combination thereof. The communication interface 93 may perform communication with other elements of the plasma processing system 1 through a communication line such as a local area network (LAN) or the like.

<Wafer Processing of Plasma Processing System 1>

Next, wafer processing performed using the plasma processing system 1 configured as described above will be described.

First, the transfer mechanism 40 carries the wafer W out of the desired FOUP 31 and carries the wafer W into the load lock module 20. After that, the inside of the load lock module 20 is sealed and depressurized. After that, the inside of the load lock module 20 communicates with the inside of the transfer module 50.

Next, the wafer W is held by the transfer mechanism 70 and transferred from the load lock module 20 to the transfer module 50.

Thereafter, the gate valve 62 is opened, and the wafer W is loaded into the desired processing module 60 by the transfer mechanism 70. After that, the gate valve 62 is closed, and the wafer W is subjected to desired processing in the processing module 60. The processing performed on the wafer W in the processing module 60 will be described below.

Next, the gate valve 62 is opened, and the wafer W is unloaded from the processing module 60 by the transfer mechanism 70. After that, the gate valve 62 is closed.

Next, the wafer W is loaded into the load lock module 21 by the transfer mechanism 70. When the wafer W is loaded into the load lock module 21, the inside of the load lock module 21 is sealed and opened to the atmosphere. After that, the inside of the load lock module 21 communicates with the inside of the loader module 30.

Then, the transfer mechanism 40 holds the wafer W and returns the wafer W from the load lock module 21 to the desired FOUP 31 through the loader module 30 so as to be accommodated. With this, a series of processes for processing the wafer in the plasma processing system 1 is ended.

<Processing Module 60>

Figure 2:
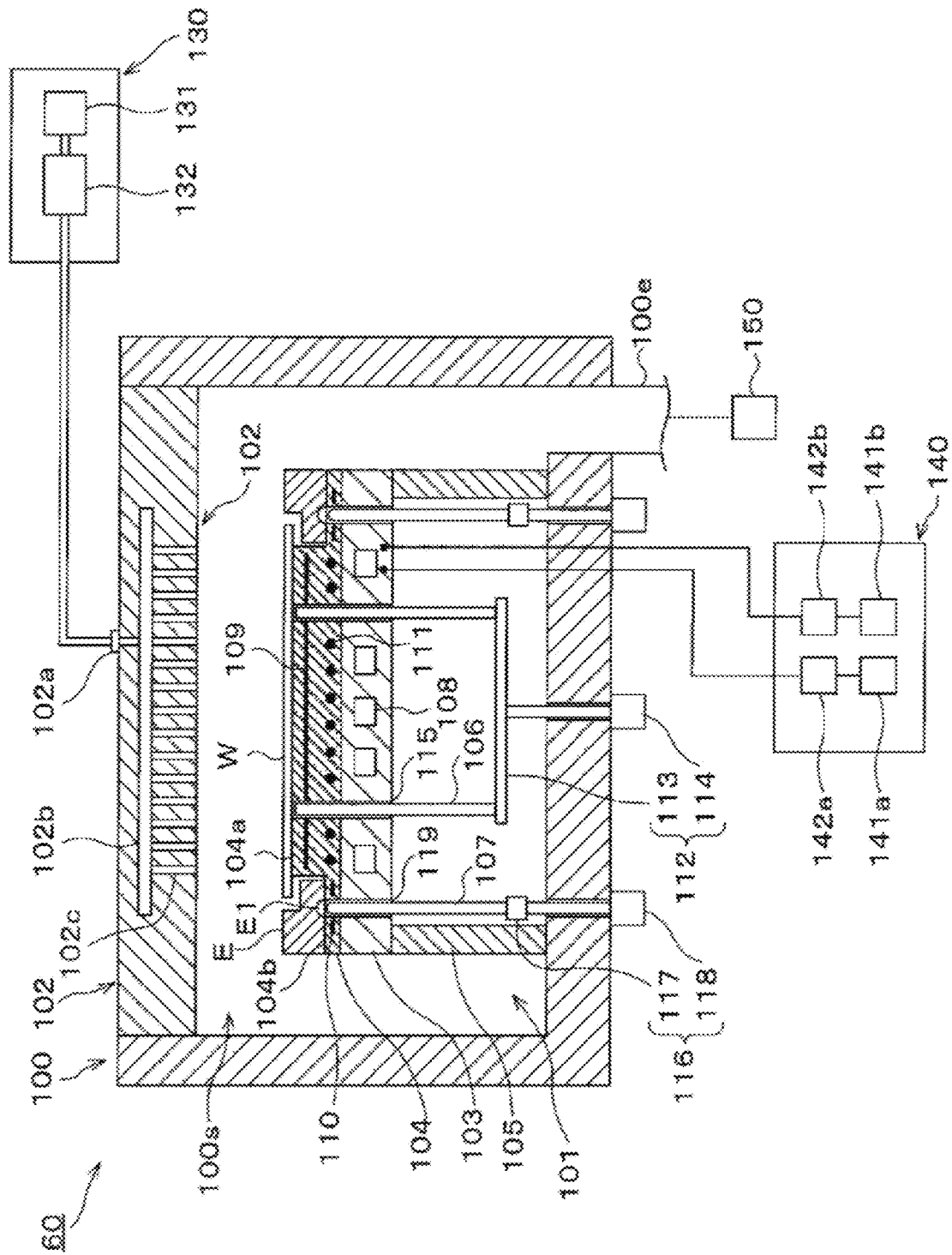
FIG. 2 is a longitudinal cross-sectional view illustrating an outline of a configuration of a processing module.
Figure 3:
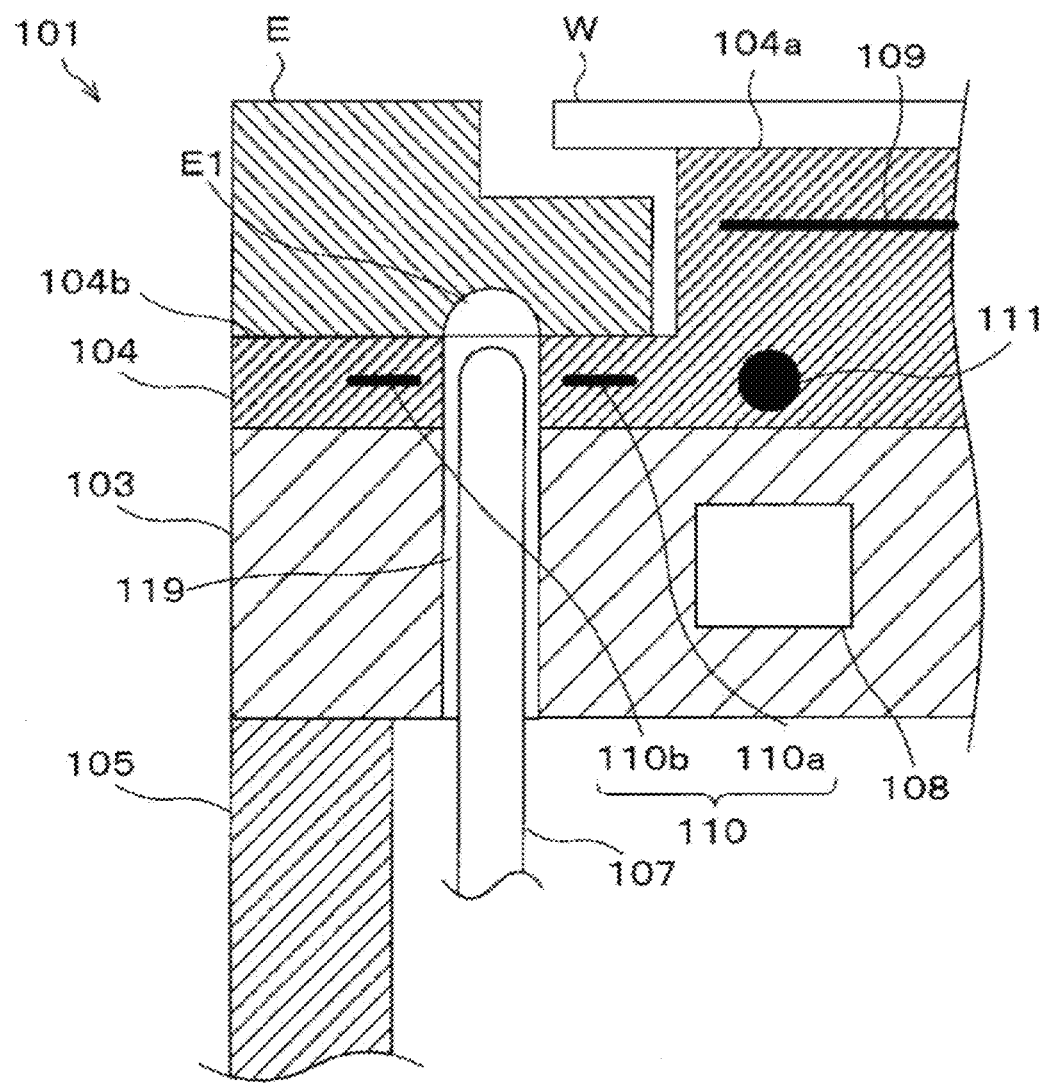
FIG. 3 is a partially enlarged view of FIG. 2.

Next, the processing module 60 will be described with reference to FIGS. 2 and 3. FIG. 2 is a longitudinal cross-sectional view illustrating an outline of a configuration of the processing module 60. FIG. 3 is a partially enlarged view of FIG. 2.

As shown in FIG. 2, the processing module 60 includes the plasma processing chamber 100, a gas supply unit 130, a radio frequency (RF) power supply unit 140, and an exhaust system 150. In addition, the processing module 60 includes a wafer support 101 as a substrate support and an upper electrode 102.

The wafer support 101 is disposed in a lower region of a plasma processing space 100s in the plasma processing chamber 100 capable of being depressurized. The upper electrode 102 is positioned above the wafer support 101 and may function as a part of a ceiling of the plasma processing chamber 100.

The wafer support 101 is configured to support the wafer W in the plasma processing space 100s. In one embodiment, the wafer support 101 includes a lower electrode 103, an electrostatic chuck 104, an insulator 105, a lifter 106, and a lifter 107. In addition, the wafer support 101 includes a temperature adjustment mechanism configured to adjust a temperature of the electrostatic chuck 104 or the like to a target temperature. The temperature adjustment mechanism includes, for example, a heater, a flow path, or a combination thereof. A temperature control fluid such as a refrigerant or a heat transfer gas flows in the flow path.

The lower electrode 103 is made of, for example, a conductive material such as aluminum. In one embodiment, a flow path 108 for the temperature control fluid constituting a part of the temperature adjustment mechanism is formed inside the lower electrode 103. The temperature control fluid is supplied to the flow path 108 from, for example, a chiller unit (not shown) provided outside the plasma processing chamber 100. The temperature control fluid supplied to the flow path 108 returns to the chiller unit. For example, the electrostatic chuck 104 and the wafer W or the edge ring E mounted on the electrostatic chuck 104 may be cooled to a target temperature by circulating low-temperature brine as a temperature control fluid in the flow path 108. In addition, for example, the electrostatic chuck 104 and the wafer W or the edge ring E mounted on the electrostatic chuck 104 may be heated to a certain temperature by circulating high-temperature brine as a temperature control fluid in the flow path 108.

The electrostatic chuck 104 is a member capable of adsorbing and holding both the wafer W and the edge ring E with an electrostatic force and is provided on the lower electrode 103. In one embodiment, an upper surface of a central portion of the electrostatic chuck 104 is at a higher level than an upper surface of a peripheral portion thereof. An upper surface 104a of the central portion of the electrostatic chuck 104 serves as a substrate mounting surface on which the wafer W is mounted, and an upper surface 104b of the peripheral portion of the electrostatic chuck 104 serves as an annular member mounting surface (hereinafter referred to as "ring mounting surface") on which the edge ring E, which is an example of an annular member (ring), is mounted. The edge ring E is a member which has an annular shape in a plan view and is disposed adjacent to the wafer W so as to surround the wafer W mounted on the upper surface 104a of the central portion of the electrostatic chuck 104.

An electrode 109 for holding the wafer W through electrostatic adsorption is provided at the central portion of the electrostatic chuck 104, and an electrode 110 for holding the edge ring E1 through electrostatic adsorption is provided at the peripheral portion of the electrostatic chuck 104.

A direct current (DC) voltage is applied from a DC power source (not shown) to the electrode 109. Due to an electrostatic force generated by the DC voltage, the wafer W is adsorbed and held on the upper surface 104a of the central portion of the electrostatic chuck 104. Similarly, a DC voltage from the DC power source (not shown) is applied to the electrode 110. Due to an electrostatic force generated by the DC voltage, the edge ring E1 is adsorbed and held on the upper surface 104b of the peripheral portion of the electrostatic chuck 104. As shown in FIG. 3, the electrode 110 is a bipolar type including a pair of electrodes 110a and 110b.

In the present embodiment, although the central portion of the electrostatic chuck 104 provided with the electrode 109 for adsorbing and holding the wafer W and the peripheral portion thereof provided with the electrode 110 for adsorbing and holding the edge ring E are integrated, the central portion and the peripheral portion may be separate bodies. That is, an electrostatic chuck for the edge ring E, which is not integrated with an electrostatic chuck for the wafer W, may be provided separately.

Furthermore, in the present embodiment, although the electrode 110 for adsorbing and holding the edge ring E is described as being the bipolar type, the electrode 110 may be a unipolar type.

In addition, the central portion of the electrostatic chuck 104 is formed, for example, to have a diameter smaller than a diameter of the wafer W, and as shown in FIG. 2, when the wafer W is mounted on the upper surface 104a of the central portion of the electrostatic chuck 104, a peripheral portion of the wafer W protrudes from the central portion of the electrostatic chuck 104.

In addition, a stepped portion is formed at an upper portion of the edge ring E, and an upper surface of an outer peripheral portion of the edge ring E is formed at a higher level than an upper surface of an inner peripheral portion thereof. The inner peripheral portion of the edge ring E1 is formed to protrude under the peripheral portion of the wafer W protruding from the central portion of the electrostatic chuck 104. That is, an inner diameter of the edge ring E1 is formed to be less than an outer diameter of the wafer W.

Although not shown, a gas supply hole is formed in the upper surface 104a of the central portion of the electrostatic chuck 104 to supply a heat transfer gas to a rear surface of the wafer W mounted on the upper surface 104a. The heat transfer gas is supplied from a gas supply unit (not shown) to the gas supply hole. The gas supply unit may include one or more gas sources and one or more pressure controllers. In one embodiment, the gas supply unit is configured to, for example, supply the heat transfer gas from the gas source to the gas supply hole through the pressure controller. The gas supply unit and the gas supply hole may constitute a part of the temperature adjustment mechanism.

In one embodiment, a heater 111 (specifically, a resistance heating element) which constitutes a part of the temperature adjustment mechanism is provided inside the electrostatic chuck 104. By allowing a current to flow in the heater 111, the electrostatic chuck 104 and the wafer W or the edge ring E mounted on the electrostatic chuck 104 may be heated to a target temperature.

The electrostatic chuck 104 has, for example, a configuration in which the heater 111 is embedded between the electrodes 109 and 110 interposed between insulators made of an insulating material.

The insulator 105 is a cylindrical member made of an insulating material such as a ceramic and supports the electrostatic chuck 104 through the lower electrode 103. For example, the insulator 105 is formed to have an outer diameter that is the same as an outer diameter of the lower electrode 103 and supports a peripheral portion of the lower electrode 103.

The lifter 106 shown in FIG. 2 is a member which is elevated to pass through the upper surface 104a of the central portion of the electrostatic chuck 104 and is formed in a columnar shape using, for example, a ceramic material. When the lifter 106 is lifted, an upper end thereof may protrude from the upper surface 104a and may support the wafer W. Through the lifter 106, the wafer W may be transferred between the electrostatic chuck 104 and the transfer arm 71 of the transfer mechanism 70.

In addition, three or more lifters 106 are provided at intervals to vertically extend.

The lifter 106 is connected to a lifting mechanism 112 (that is, an actuator) which elevates the lifter 106. For example, the lifting mechanism 112 includes a support member 113 which supports the plurality of lifters 106 and a driving unit 114 which generates a driving force for elevating the support member 113 to elevate the plurality of lifters 106. The driving unit 114 includes, for example, a motor (not shown) as a driving source for generating the driving force.

The lifter 106 is inserted into an insertion hole 115 having an open upper end in the upper surface 104a of the central portion of the electrostatic chuck 104. For example, the insertion hole 115 is formed to extend in a downward direction from the upper surface 104a of the central portion of the electrostatic chuck 104 to a bottom surface of the lower electrode 103. In other words, the insertion hole 115 is formed to pass through the central portion of the electrostatic chuck 104 and the lower electrode 103.

The lifter 107 is a member which is elevated to pass through the upper surface 104b of the peripheral portion of the electrostatic chuck 104 and is formed in a columnar shape using, for example, alumina, quartz, SUS, or the like. When the lifter 107 is lifted, an upper end thereof may protrude from the upper surface 104b of the peripheral portion of the electrostatic chuck 104 and may support the edge ring E. Through the lifter 107, the edge ring E may be transferred between the electrostatic chuck 104 and the transfer arm 71 of the transfer mechanism 70.

The lifter 107 is provided in each of insertion holes 119 described below. For example, three or more lifters 107 are provided at intervals in a circumferential direction of the electrostatic chuck 104, that is, a circumferential direction of the upper surface 104a of the central portion and the upper surface 104b of the peripheral portion in a plan view. In addition, the lifters 107 are provided, for example, at equal intervals in the circumferential direction in a plan view. Furthermore, for example, the lifter 107 is provided to vertically extend.

The lifter 107 is connected to a lifting mechanism 116 (for example, an actuator) which elevates the lifter 107. For example, the lifting mechanism 116 is provided for each lifter 107 and includes a support member 117 which vertically and movably supports the lifter 107. The support member 117 includes for example, a thrust bearing so as to vertically and movably support the lifter 107. In addition, the lifting mechanism 116 includes a driving unit 118 which generates a driving force for elevating the support member 117 to elevate the lifter 107. The driving unit 118 includes, for example, a motor (not shown) as a driving source for generating the driving force.

The lifter 107 is positioned with respect to the electrostatic chuck 104 and is inserted into the insertion hole 119 having an open upper end in the upper surface 104b of the peripheral portion of the electrostatic chuck 104. Therefore, when the electrostatic chuck 104 is thermally expanded or contracted, at least an upper end portion of the lifter 107 is moved according to the thermal expansion or contraction. For example, the insertion hole 119 is formed to extend in a downward direction from the upper surface 104b of the peripheral portion of the electrostatic chuck 104 to the bottom surface of the lower electrode 103. In other words, the insertion hole 119 is formed to pass through the peripheral portion of the electrostatic chuck 104 and the lower electrode 103.

The plurality of insertion holes 119 are formed in the electrostatic chuck 104. For example, three or more insertion holes 119 are provided at intervals in the circumferential direction of the electrostatic chuck 104, that is, the circumferential direction of the upper surface 104a of the central portion and the upper surface 104b of the peripheral portion in a plan view. In addition, the insertion holes 119 are provided, for example, at equal intervals in the circumferential direction in a plan view. As described above, the lifter 107 is provided for each of the insertion holes 119.

When the lifter 107 is lifted, the upper end portion of the lifter 107 comes into contact with a bottom surface of the edge ring E to support the edge ring E. On the bottom surface of the edge ring E, a concave portion E1 for positioning, into which the upper end of the lifter 107 is fitted, is formed for each lifter 107.

The upper end portion of the lifter 107 and the concave portion E1 of the edge ring E are formed, for example, in the following shape.

That is, the upper end portion of the lifter 107 and the concave portion E1 of the edge ring E have such a shape that, in a state where the upper end portion of the lifter 107 is fitted into the concave portion E1 of the edge ring E, immediately after the lifter 107 supports the edge ring E, even when the lifter 107 and the edge ring E do not have a desired positional relationship, the lifter 107 slides on the upper end portion of the edge ring E due to the dead load thereof or the like and thus the lifter 107 and the edge ring E have a desired positional relationship. Specifically, for example, as shown in FIG. 3, the upper end portion of the lifter 107 may be formed in a hemispherical shape of which an upper side is a hemispherical surface, and the concave portion E1 of the edge ring E may be formed to be recessed in a hemispherical shape of which an upper side is a hemispherical surface. In addition, shapes of the upper end portion of the lifter 107 and the concave portion E1 of the edge ring E may not be a hemispherical shape.

Furthermore, in the present example, the lower electrode 103 and the electrostatic chuck 104 may constitute a support unit including the above-described substrate mounting surface and ring mounting surface.

Returning to FIG. 2, the upper electrode 102 also functions as a shower head which supplies one or more processing gases from the gas supply unit 130 to the plasma processing space 100s. In one embodiment, the upper electrode 102 includes a gas inlet 102a, a gas diffusion chamber 102b, and a plurality of gas outlets 102c. For example, the gas inlet 102a fluidly communicates with the gas supply unit 130 and the gas diffusion chamber 102b. The plurality of gas outlets 102c fluidly communicate with the gas diffusion chamber 102b and the plasma processing space 100s. In one embodiment, the upper electrode 102 is configured to supply one or more processing gases from the gas inlet 102a to the plasma processing space 100s through the gas diffusion chamber 102b and the plurality of gas outlets 102c.

The gas supply unit 130 may include one or more gas sources 131 and one or more flow controllers 132. In one embodiment, the gas supply unit 130 is configured to, for example, supply one or more processing gases (including cleaning gases) from each corresponding gas source 131 to the gas inlet 102a through each corresponding flow controller 132. Each flow controller 132 may include, for example, a mass flow controller or a pressure control type flow controller. Furthermore, the gas supply unit 130 may include one or more flow rate modulation devices which modulate or pulse a flow rate of one or more processing gases.

The RF power supply unit 140 is configured to supply RF power, for example, one or more RF signals, to one or more electrodes such as the lower electrode 103, the upper electrode 102, or both the lower electrode 103 and the upper electrode 102. As a result, plasma is generated from one or more processing gases supplied to the plasma processing space 100s. Therefore, the RF power supply unit 140 may function as at least a part of a plasma generator configured to generate plasma from one or more processing gases in the plasma processing chamber. The RF power supply unit 140 includes, for example, two RF generators 141a and 141b and two matching circuits 142a and 142b. In one embodiment, the RF power supply unit 140 is configured to supply a first RF signal from a first RF generator 141a to the lower electrode 103 through a first matching circuit 142a. For example, the first RF signal may have a frequency in a range of 27 MHz to 100 MHz.

In addition, in one embodiment, the RF power supply unit 140 is configured to supply a second RF signal from a second RF generator 141b to the lower electrode 103 through a second matching circuit 142b. For example, the second RF signal may have a frequency in a range of 400 kHz to 13.56 MHz. A voltage pulse other than RF may be supplied instead of the second RF signal. The voltage pulse may be a negative DC voltage. In another example, the voltage pulse may be a triangular wave or an impulse.

In addition, although not shown, other embodiments are conceived in the present disclosure. For example, in an alternative embodiment, the RF power supply unit 140 may be configured to supply the first RF signal from an RF generator to the lower electrode 103, supply the second RF signal from another RF generator to the lower electrode 103, and supply a third RF signal from still another RF generator to the lower electrode 103. In addition, in another alternative embodiment, a DC voltage may be applied to the upper electrode 102.

Furthermore, in various embodiments, an amplitude of one or more RF signals (that is, the first RF signal, the second RF signal, and the like) may be pulsed or modulated. The modulation of the amplitude may include pulsing an amplitude of the RF signal between an on-state and an off-state or between two or more different on-states.

The exhaust system 150 may be connected to, for example, an exhaust port 100e provided in a bottom of the plasma processing chamber 100. The exhaust system 150 may include a pressure valve and a vacuum pump. The vacuum pump may include a turbo molecular pump, a roughing pump, or a combination thereof.

<Wafer Processing of Processing Module 60>

Next, an example of wafer processing performed using the processing module 60 will be described. In addition, in the processing module 60, the wafer W is subjected to processing, for example, etching processing.

First, the wafer W is loaded into the plasma processing chamber 100 by the transfer mechanism 70 and mounted on the electrostatic chuck 104 by elevating the lifter 106. After that, a DC voltage is applied to the electrode 109 of the electrostatic chuck 104, and thus, the wafer W is electrostatically adsorbed and held by the electrostatic chuck 104 by an electrostatic force. In addition, after the wafer W is loaded into the plasma processing chamber 100, the inside of the plasma processing chamber 100 is depressurized to a predetermined degree of vacuum by the exhaust system 150.

Next, a processing gas is supplied from the gas supply unit 130 to the plasma processing space 100s through the upper electrode 102. Further, RF power HF for plasma generation is supplied from the RF power supply unit 140 to the lower electrode 103, thereby exciting the processing gas to generate plasma. In this case, RF power LF for ion attraction may be supplied from the RF power supply unit 140. The wafer W is subjected to plasma processing by an action of the generated plasma.

In addition, during the plasma processing, a heat transfer gas such as a He gas, an Ar gas, or the like is supplied through a heat transfer gas supply path (not shown) toward bottom surfaces of the wafer W and the edge ring E adsorbed and held by the electrostatic chuck 104.

When the plasma processing is ended, the supply of the RF power HF from the RF power supply unit 140 and the supply of the processing gas from the gas supply unit 130 are performed. When RF power LF is supplied during the plasma processing, the supply of the RF power LF is also stopped. Next, the adsorbing and holding of the wafer W by the electrostatic chuck 104 are stopped. In addition, the supply of the heat transfer gas to the bottom surface of the wafer W may be stopped.

After that, the wafer W is lifted by the lifter 107, and the wafer W is separated from the electrostatic chuck 104. At the time of separation, a static elimination process may be performed on the wafer W. The wafer W is unloaded from the plasma processing chamber 100, and a series of processes for processing the wafer is ended by the transfer mechanism 70.

<Mounting Process>

Figure 4:
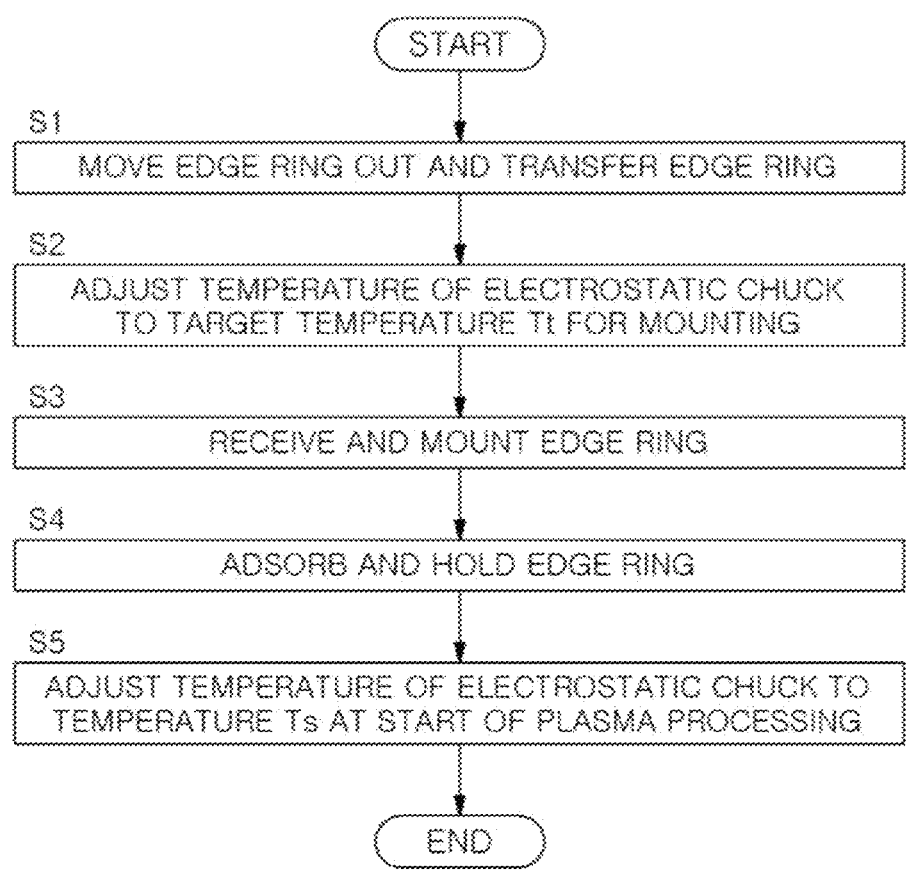
FIG. 4 is a flowchart for describing an example of a mounting process of an edge ring on a wafer support in a plasma processing system (1) of FIG. 1.
Figure 5:
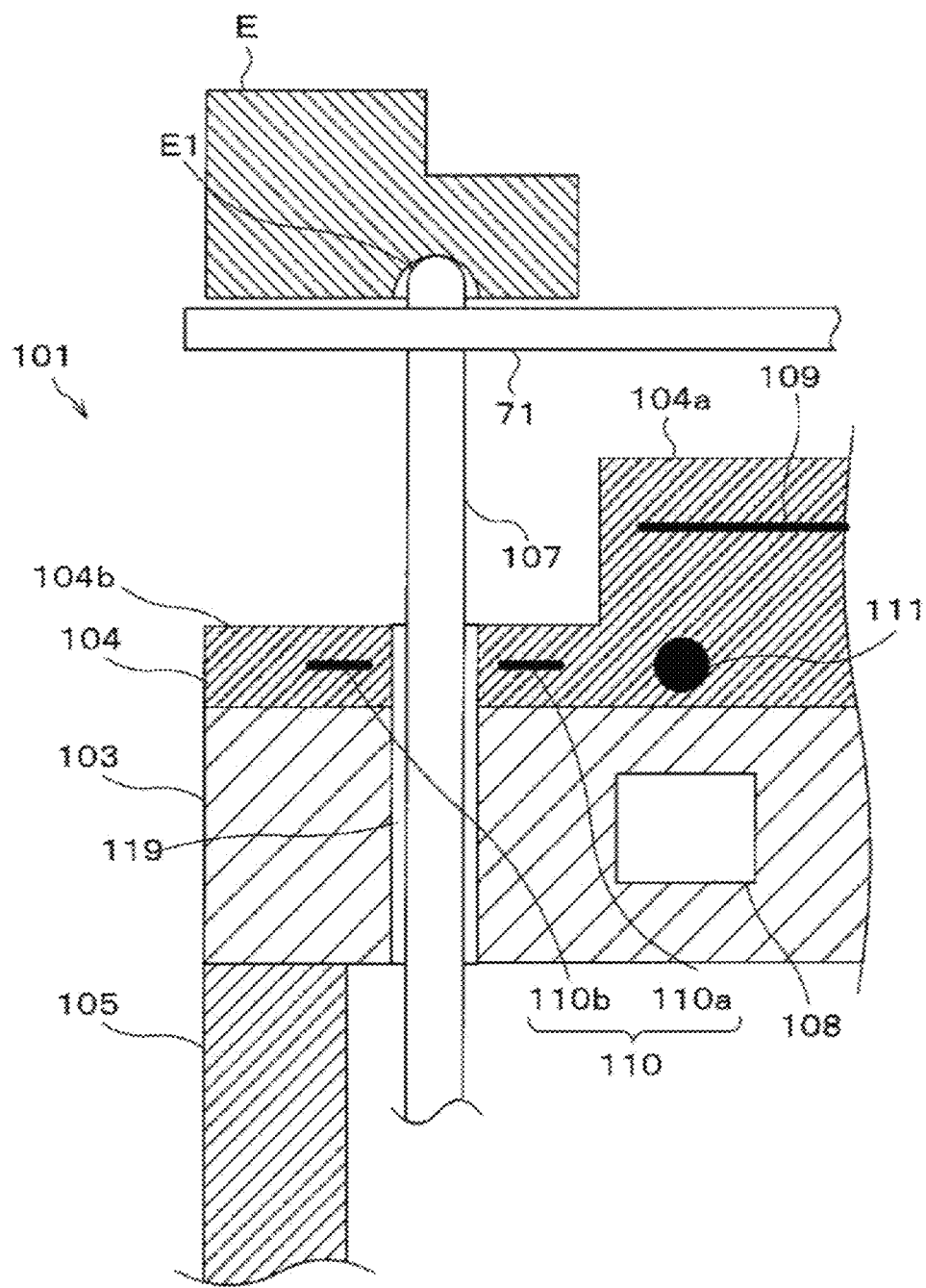
FIG. 5 is a view illustrating a state inside a plasma processing chamber during the mounting process.

Next, an example of a mounting process of the edge ring E on the wafer support 101 in the plasma processing system 1 will be described with reference to FIGS. 4 and 5. FIG. 4 is a flowchart for describing an example of the above mounting process. FIG. 5 is a view illustrating a state inside the plasma processing chamber 100 during the mounting process. The following process is performed under control of the controler 80. In addition, the following process is started from a state in which the edge ring E is not present on the wafer support 101 of the processing module 60 which is a mounting target for the edge ring E, that is, from a state in which the edge ring E is carried out of the processing module 60.

(Step S1: Carry-Out and Transfer of Edge Ring E)

As shown in FIG. 4, first, the edge ring E is carried out of the accommodation module 61, and the edge ring E is transferred above the peripheral portion of the electrostatic chuck 104 included in the processing module 60 which is the mounting target for the edge ring E.

Specifically, for example, the transfer arm 71 of the transfer mechanism 70 is inserted into the accommodation module 61, and one edge ring E is held by the transfer arm 71. Next, the transfer arm 71 holding the edge ring E is drawn out of the accommodation module 61. Subsequently, the transfer arm 71 holding the edge ring E is inserted into the depressurized plasma processing chamber 100 of the processing module 60, which is the mounting target, through a carry-in/out port (not shown). The edge ring E held by the transfer arm 71 is transferred above the peripheral portion of the electrostatic chuck 104. The edge ring E is held by the transfer arm 71 after a circumferential orientation thereof is adjusted.

(Step S2: Temperature Adjustment of Electrostatic Chuck 104)

In addition, in the processing module 60 which is the mounting target for the edge ring E, a temperature of a portion of the wafer support 101 on which the edge ring E is mounted is adjusted to a preset temperature Tt (hereinafter, "target temperature for mounting") at which a position of each concave portion E1 of the edge ring E matches positions of the corresponding lifter 107 and insertion hole 119.

Specifically, for example, in the processing module 60 which is the mounting target for the edge ring E, a temperature of the electrostatic chuck 104 is adjusted to the target temperature Tt for mounting by at least one of a temperature adjustment mechanism including the flow path 108 and a temperature adjustment mechanism including the heater 111. For example, the adjustment of the temperature of the electrostatic chuck 104 is started after the transfer mechanism 70 starts an operation of carrying out the edge ring E from the accommodation module 61 and is completed when the transfer arm 71 holding the edge ring E is inserted into the plasma processing chamber 100.

The target temperature Tt for mounting is set, for example, in a range of 40° C. to 80° C.

In addition, the target temperature Tt for mounting may be set, for example, in a range of ±10° C. with reference to a preset temperature Ts (hereinafter referred to as "plasma processing start temperature") of the electrostatic chuck 104 at the start of plasma processing. In other words, the concave portion E1 of the edge ring E may be formed such that the target temperature Tt for mounting satisfies the following condition.

$$Ts-10 \leq Tt \leq Ts+10.$$

(Step S3: Receiving and Mounting of Edge Ring E)

Next, the edge ring E is received by the lifter 107 protruding from the upper surface 104b of the peripheral portion of the electrostatic chuck 104 of which the temperature is adjusted to the target temperature Tt for mounting, and the edge ring E is mounted on the upper surface 104b of the peripheral portion of the electrostatic chuck 104.

Specifically, all the lifters 107 are lifted, and each lifter 107 protrudes from the upper surface 104b of the peripheral portion of the electrostatic chuck 104 of which the temperature is adjusted to the target temperature Tt for mounting, and the upper end portion of each lifter 107 comes into contact with the bottom surface of the edge ring E held by the transfer arm 71.

Here, unlike the present embodiment, a case in which the temperature of the electrostatic chuck 104 in step S2 is not adjusted is conceived. In this case, according to a temperature of the electrostatic chuck 104 at the start of a mounting process, at a time point at which all the lifters 107 are lifted, a position of each of the concave portions E1 of the edge ring E may not match a position of the corresponding insertion hole 119 due to thermal expansion or contraction of the electrostatic chuck 104. That is, when the lifter 107 inserted through the insertion hole 119 is lifted, the upper end portion of the lifter 107 may not be fitted into the concave portion E1 of the edge ring E.

On the other hand, in the present embodiment, at a time point at which all the lifters 107 are lifted in the present step S3, as described above, a temperature of the electrostatic chuck 104 is adjusted to the target temperature Tt for mounting, and the position of each concave portion E1 of the edge ring E matches the position of the corresponding insertion hole 119. Therefore, when the lifter 107 inserted into the insertion hole 119 is lifted, the upper end portion of the lifter 107 is fitted into the concave portion E1 of the edge ring E.

Even after the upper end portion of the lifter 107 comes into contact with the bottom surface of the edge ring E, the lifter 107 continues to be lifted, and as shown in FIG. 5, the edge ring E is received and supported by the lifter 107. Immediately after the receiving, even when the edge ring E deviates from a desired position with respect to the lifter 107, the edge ring E slides on the upper end portion of the lifter 107 due to the dead load thereof or the like and is positioned with respect to the lifter 107. For example, the edge ring E is positioned at a position at which the deepest portion of the concave portion E1 and a top portion of the upper end portion of the lifter 107 match each other in a plan view.

In addition, after the edge ring E is received by the lifter 107, in order to promote movement for positioning, each of the lifters 107 may be finely elevated, or the lifters 107 may be lowered at different speeds or lowered at a high speed.

After the edge ring E is received by the lifter 107, the transfer arm 71 is drawn out of the plasma processing chamber 100. In addition, after the edge ring E is positioned with respect to the lifter 107, all the lifters 107 are lowered, whereby the edge ring E is mounted on the upper surface 104b of the peripheral portion of the electrostatic chuck 104.

Since the lifter 107 is positioned with respect to the electrostatic chuck 104, the edge ring E being positioned with respect to the lifter 107 as described above means that the edge ring E is positioned with respect to the insertion hole 119. In addition, the edge ring E being positioned with respect to the lifter 107 means that the edge ring E is positioned with respect to the electrostatic chuck 104 (center thereof) in which the insertion hole 119 is formed. Therefore, in the present step S3, the edge ring E is mounted on the upper surface 104b in a state where the edge ring E is positioned with respect to the electrostatic chuck 104 (center thereof)

(Step S4: Adsorbing and Holding of Edge Ring E)

Subsequently, the edge ring E is adsorbed and held on the wafer support 101.

Specifically, for example, a DC voltage from the DC power source (not shown) is applied to the electrode 110 provided at the peripheral portion of the electrostatic chuck 104, and due to an electrostatic force generated by the DC voltage, the edge ring E is adsorbed and held on the upper surface 104b of the peripheral portion of the electrostatic chuck 104. More specifically, different voltages are applied to the electrodes 110a and 110b, and due to an electrostatic force generated by the voltages, the edge ring E is adsorbed and held on the upper surface 104b of the peripheral portion of the electrostatic chuck 104. In addition, when a separate electrostatic chuck for the edge ring E, which is not integrated with an electrostatic chuck for the wafer W, is provided separately, a DC voltage from the DC power source is applied to an electrode provided in the separate electrostatic chuck for the edge ring E, and due to electrostatic force generated by the DC voltage, the edge ring E is adsorbed and held.

By performing adsorption as in the present step S4, the edge ring E is positioned with respect to the electrostatic chuck 104, and the mounted edge ring E may be fixed to the electrostatic chuck 104.

(Step S5: Temperature Adjustment of Electrostatic Chuck 104)

After that, a temperature of the electrostatic chuck 104 on which the edge ring E is mounted is adjusted to a plasma processing start temperature Ts in the processing module 60 which is the mounting target.

Specifically, for example, in the processing module 60 which is the mounting target, the temperature of the electrostatic chuck 104 is adjusted to the plasma processing start temperature Ts by at least one of the temperature adjustment mechanism including the flow path 108 and the temperature adjustment mechanism including the heater 111.

As a result, a series of mounting processes of the edge ring E is completed.

After the mounting process, wafer processing, that is, plasma processing is started in the processing module 60 in which the edge ring E is mounted.

In addition, a dummy run may be performed a plurality of times before the plasma processing is started. That is, a plurality of dummy runs may be included in a series of mounting processes. The dummy run means that plasma processing actually performed on the wafer W is performed on a dummy wafer.

<Separating Process>

Figure 6:
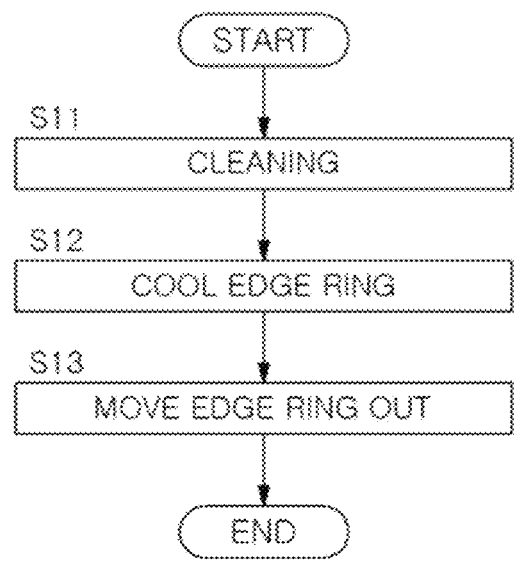
FIG. 6 is a flowchart for describing an example of a separating process of an edge ring from a wafer support in the plasma processing system of FIG. 1.
Figure 7:
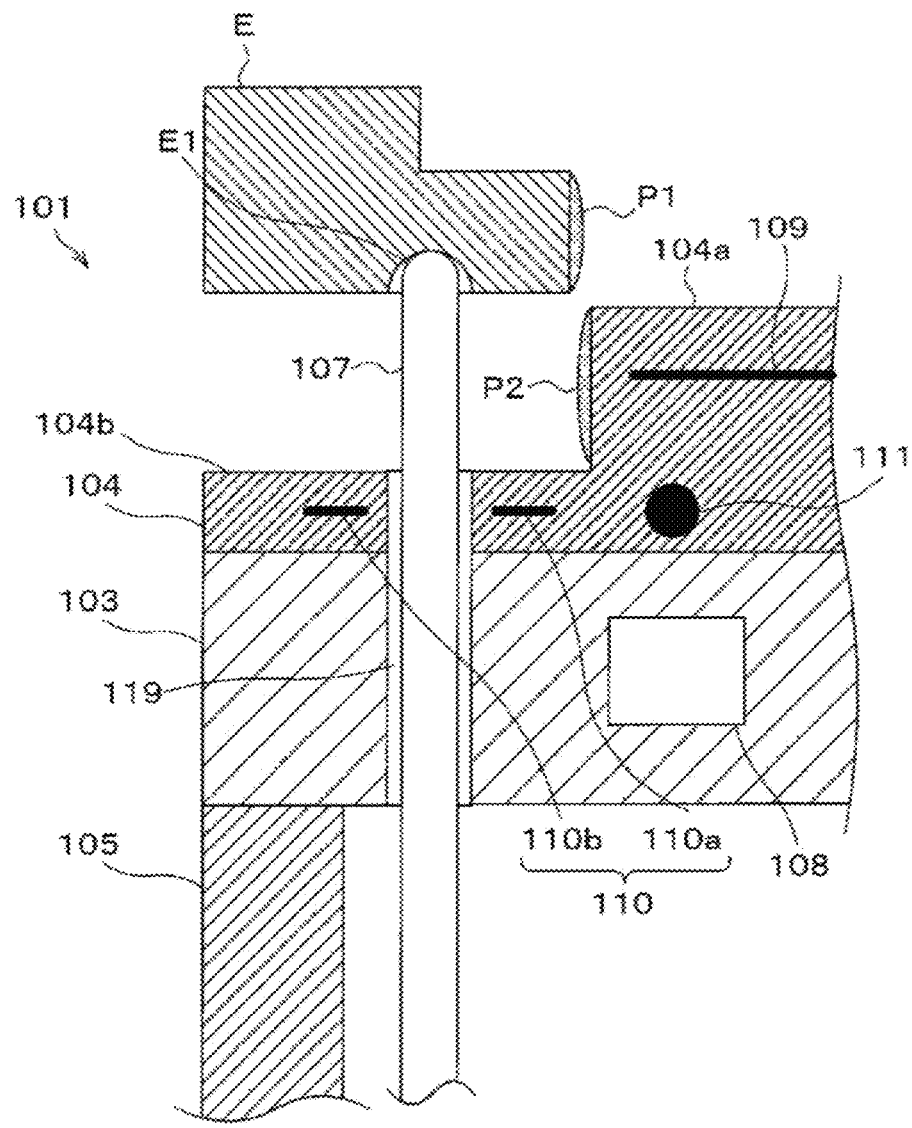
FIG. 7 is a view illustrating a state inside the plasma processing chamber during the separating process.

Next, an example of a separating process of the edge ring E from the wafer support 101 in the plasma processing system 1 will be described with reference to FIGS. 6 and 7. FIG. 6 is a flowchart for describing an example of the separation process. FIG. 7 is a view illustrating a state inside the plasma processing chamber 100 during the separating process. In addition, the following process is performed under control of the controler 80 and is performed in a state in which the wafer W is not present on the electrostatic chuck 104.

(Step S11: Cleaning)

When a life time of the edge ring E is almost completed (specifically, for example, when the plasma processing is performed a preset number of times after the edge ring E is mounted), as shown in FIG. 6, a cleaning process of removing a reaction product attached to the edge ring E during the plasma processing, that is, a removal process is performed.

Specifically, for example, first, the application of the DC voltage to the electrode 110 provided at the peripheral portion of the electrostatic chuck 104 is stopped, and the adsorbing and holding of the edge ring E to the electrostatic chuck 104 are released. Next, all the lifters 107 are lifted, and as shown in FIG. 7, the edge ring E is transferred from the electrostatic chuck 104 to the lifter 107 and lifted. The edge ring E is lifted until the bottom surface of the edge ring E is positioned at a higher level than the upper surface 104a of the central portion of the electrostatic chuck 104.

After that, a cleaning gas is supplied from the gas supply unit 130 to the plasma processing space 100s through the upper electrode 102. Further, RF power HF for plasma generation is supplied from the RF power supply unit 140 to the lower electrode 103, thereby exciting the cleaning gas to generate plasma. In this case, RF power LF for ion attraction may be supplied from the RF power supply unit 140. For example, a reaction product P1 attached to an inner side end surface of the edge ring E is removed by an action of the generated plasma. In addition, in this case, a reaction product P2 attached to a side end surface of the central portion of the electrostatic chuck 104 may also be removed.

When the removal process is terminated, the supply of the RF power HF from the RF power supply unit 140 and the supply of the cleaning gas from the gas supply unit 130 are stopped. When the RF power LF is supplied during the removal process, the supply of the RF power LF is also stopped.

(Step S12: Cooling of Edge Ring E)

Next, since the edge ring E is heated to a high temperature due to the removal process performed in step S11, the edge ring E is cooled.

Specifically, for example, first, all the lifters 107 are lowered, and the edge ring E is mounted again on the upper surface 104b of the peripheral portion of the electrostatic chuck 104 by the lowered lifter 107. Next, a DC voltage from the DC power source (not shown) is applied to the electrode 110 provided at the peripheral portion of the electrostatic chuck 104, and due to an electrostatic force generated by the DC voltage, the edge ring E is adsorbed and held on the upper surface 104b of the peripheral portion of the electrostatic chuck 104. The electrostatic chuck 104 is cooled by the temperature adjustment mechanism including the flow path 108 so that the edge ring E adsorbed and held by the electrostatic chuck 104 is also cooled. The edge ring E is cooled, for example, to a temperature (specifically, a temperature of 200° C. or less) at which the transfer arm 71 is not damaged when the edge ring E is held after cooling.

(Step S13)

After cooling, the edge ring E is carried out of the processing module 60 and returned to the accommodation module 61.

Specifically, for example, first, the application of a DC voltage to the electrode 110 provided at the peripheral portion of the electrostatic chuck 104 is stopped, and the adsorbing and holding of the edge ring E to the electrostatic chuck 104 are released. Next, all the lifters 107 are lifted, and the edge ring E is separated from the electrostatic chuck 104 and held by the lifter 107. Subsequently, the transfer arm 71 is inserted into the plasma processing chamber 100 through the carry-in/out port (not shown). Next, the transfer arm 71 is moved between the upper surface 104b of the peripheral portion of the electrostatic chuck 104 and the edge ring E supported by the lifter 107. After that, all the lifters 107 are lowered, and the edge ring E is transferred from the lifter 107 to the transfer arm 71. Next, the transfer arm 71 is drawn out of the plasma processing chamber 100, and the edge ring E is carried out of the processing module 60. The transfer arm 71 holding the edge ring E is inserted into the accommodation module 61, and the edge ring E is transferred from the transfer arm 71 to a support arm (not shown) in the accommodation module 61. After that, the transfer arm 71 is drawn out of the accommodation module 61.

As a result, a series of separating processes of the edge ring E is completed.

<Effects and the Like>

As described above, in the present embodiment, when the edge ring E transferred by the transfer mechanism 70 of the transfer module 50 is supported by the lifter 107, the edge ring E is positioned with respect to the lifter 107 by the upper end portion of the lifter 107 and the concave portion E1 provided in the bottom surface of the edge ring E. In addition, the lifter 107 is positioned with respect to the electrostatic chuck 104. Therefore, when the lifter 107 supporting the edge ring E is lowered, the edge ring E is positioned with respect to the electrostatic chuck 104 and is mounted on the upper surface 104b of the peripheral portion of the electrostatic chuck 104. That is, according to the present embodiment, by using the transfer module 50, when the edge ring E is mounted on the wafer support 101, the edge ring may be appropriately positioned with respect to the wafer support 101.

In addition, in the present embodiment, a temperature of the electrostatic chuck 104 is adjusted to the target temperature Tt for mounting at a time point at which the edge ring E is transferred from the transfer mechanism 70 of the transfer module 50 to the lifter 107. Therefore, irrespective of the temperature of the electrostatic chuck 104 at the start of a mounting process of the edge ring E, the upper end portion of the lifter 107, which is inserted into the insertion hole 119 passing through the upper surface 104b of the peripheral portion of the electrostatic chuck 104, may be fitted into the concave portion E1 provided in the bottom surface of the ring E. Therefore, irrespective of the temperature of the electrostatic chuck 104 at the start of the mounting process of the edge ring E, when the edge ring E is supported by the lifter 107, the edge ring E may be positioned with respect to the lifter 107. Therefore, irrespective of the temperature of the electrostatic chuck 104 at the start of the mounting process of the edge ring E, the edge ring E may be appropriately positioned with respect to the electrostatic chuck 104 and may be mounted on the upper surface 104b of the peripheral portion of the electrostatic chuck 104. In addition, the temperature of the electrostatic chuck 104 at the start of the mounting process of the edge ring E differs according to, for example, at least one of the following conditions (A) and (B).

(A) A temperature of the electrostatic chuck 104 when processing immediately before the mounting process of the edge ring E is ended (B) An elapsed time until the mounting process of the edge ring E is started after the processing of (A) is ended In addition, in the present embodiment, as described above, the target temperature Tt for mounting may be set, for example, in a range of ±10° C. with reference to the plasma processing start temperature Ts. The target temperature Tt for mounting may be set as described above, thereby reducing the time until plasma processing is started after the edge ring E is mounted on the electrostatic chuck 104.

In addition, in the present embodiment, before the edge ring E is carried out of the processing module 60, cleaning is performed to remove the reaction product P1 attached to the edge ring E. Therefore, for example, the reaction product P1 can be prevented from being peeled off of the edge ring E during the carry-out of the edge ring E and thus can be prevented from adversely affecting subsequent plasma processing. Further, the reaction product P1 can be prevented from flowing to the decompression transfer chamber 51 of the transfer module 50.

<Modified Examples of Edge Ring and Lifter>

Figure 8:
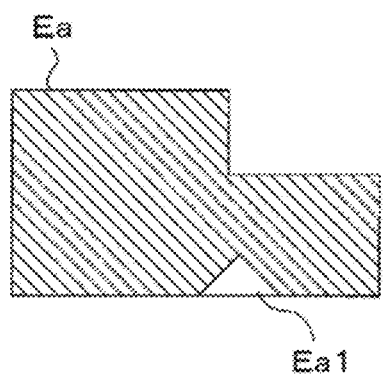
FIG. 8 is a view illustrating a modified example of an edge ring.
Figure 9:
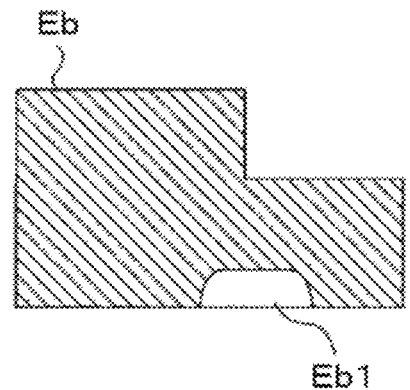
FIG. 9 is a view illustrating a modified example of an edge ring.

FIGS. 8 and 9 are views showing a modified example of an edge ring.

In the above example, a concave portion E1 for positioning an edge ring E is formed to be recessed in a hemispherical shape of which an upper side is a hemispherical surface. When a corresponding upper end portion of a lifter for an edge ring is fitted into each concave portion of the edge ring, and when the edge ring is positioned with respect to the lifter due to the dead load thereof or the like, a shape of the concave portion of the edge ring is not limited to the above example.

For example, as shown in FIG. 8, a concave portion Ea1 for positioning of an edge ring Ea may be formed to be recessed in a conical shape which has an apex on an upper side thereof. Furthermore, as shown in FIG. 9, a concave portion Eb1 of an edge ring Eb may be formed in a semi-long hole shape which has a short axis in a vertical direction and in which an upper side thereof is shorter that a lower side thereof in a cross-sectional view.

In addition, similarly, an upper end portion of a lifter 107 may be formed in a conical shape or the like which has an apex at an upper side thereof.

Furthermore, an edge ring having a concave portion for positioning formed at a position matching that of an insertion hole 119 of a high-temperature electrostatic chuck 104 and an edge ring having a concave portion for positioning formed at a position matching that of an insertion hole 119 of a low-temperature electrostatic chuck 104 may be accommodated in an accommodation module 61. That is, for each of a plurality of temperature zones, an edge ring having a concave portion for positioning formed at an appropriate position may be provided and accommodated in the accommodation module 61. A target temperature Tt for mounting may be determined with reference to a plasma processing start temperature Ts, and an edge ring corresponding to the determined target temperature Tt for mounting may be used.

<Modified Example of Transfer Mechanism>

Figure 10:
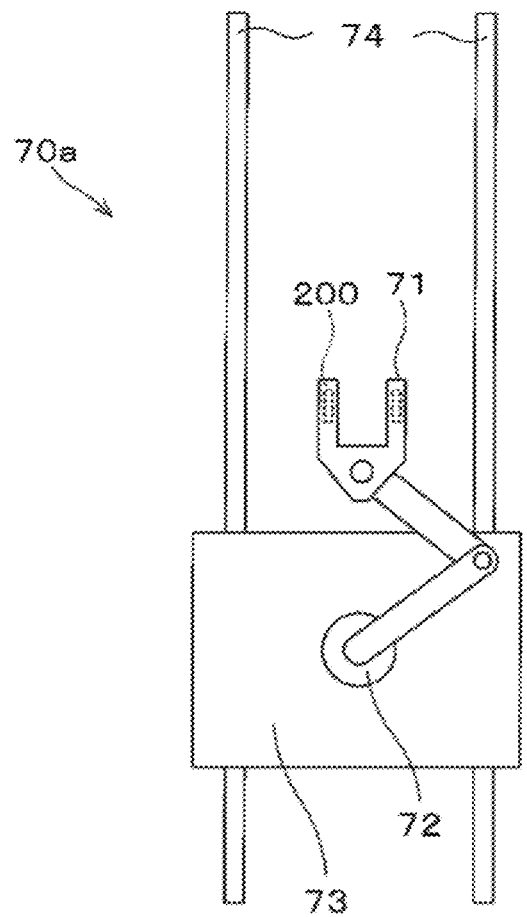
FIG. 10 is a view illustrating a modified example of a transfer mechanism included in a transfer module.

FIG. 10 is a view illustrating a modified example of a transfer mechanism included in a transfer module 50.

The transfer mechanism included in the transfer module 50 may include a temperature adjustment mechanism configured to adjust an edge ring supported by the transfer mechanism to a target temperature. The temperature adjustment mechanism includes, for example, a heater, a flow path, or a combination thereof. A temperature control fluid such as a refrigerant or a heat transfer gas flows in the flow path.

A transfer mechanism 70a of FIG. 10 is provided with a heater 200 which constitutes a part of a temperature adjustment mechanism configured to adjust a temperature of an edge ring E. The heater 200 is provided in, for example, a transfer arm 71.

When the heater 200 is provided as described above, for example, in step S3 described above, the edge ring E, of which a temperature is adjusted to a temperature corresponding to a target temperature Tt for mounting by the heater 200, is mounted on an electrostatic chuck 104. By performing such temperature adjustment, an upper end portion of a corresponding lifter 107 can be more reliably fitted into a concave portion E1 of the edge ring E.

<Modified Example of Lifter and Insertion Hole Into Which Lifter is Inserted>

Figure 11:
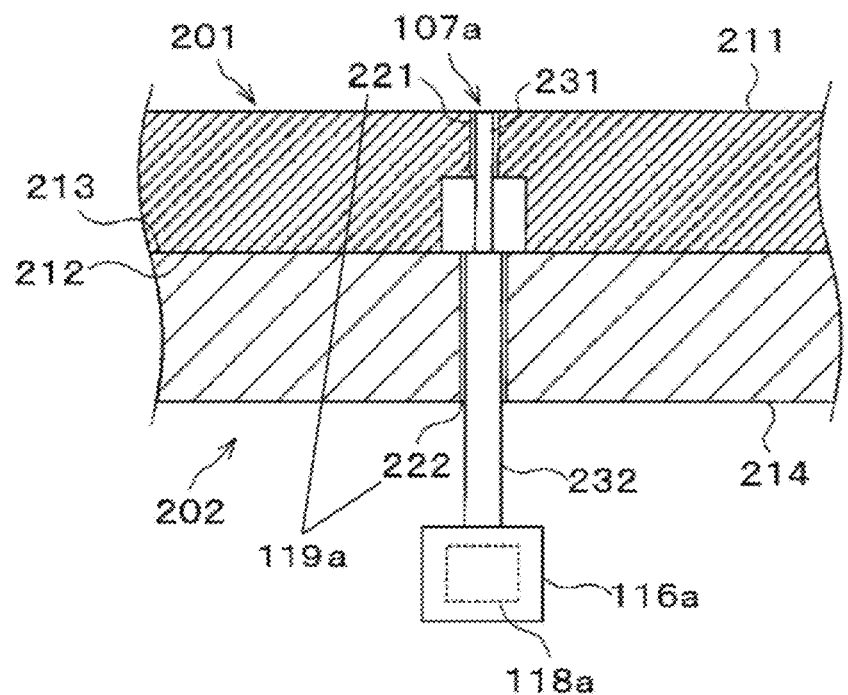
FIG. 11 is a view illustrating a modified example of a lifter for an edge ring and an insertion hole into which the lifter is inserted.

FIG. 11 is a view illustrating a modified example of a lifter for an edge ring E and an insertion hole into which the lifter is inserted.

In the example of FIG. 11, an electrostatic chuck 201 has a first surface 211 that is a ring mounting surface on which the edge ring E is mounted and a second surface 212 that is a rear surface of the first surface 211. The electrostatic chuck 201 is a first member having a first through-hole 221 which passes through the first surface 211 and the second surface 212. A plurality of first through-holes 221 are formed to correspond to arrangement positions of lifters 107a.

In addition, a lower electrode 202 is disposed to overlap the second surface 212 of the electrostatic chuck 201 and has a third surface 213 in contact with the second surface 212 and a fourth surface 214 that is a rear surface of the third surface 213. The lower electrode 202 is a second member having a second through-hole 222 which passes through the third surface 213 and the fourth surface 214 so as to correspond to a position of the first through-hole 221 and communicates with the first through-hole 221.

In the present example, an insertion hole 119a through which the lifter 107a is inserted is formed of the first through-hole 221 and the second through-hole 222. Furthermore, the lifter 107a is divided into a first lifter member 231 and a second lifter member 232. The first lifter member 231 and the second lifter member 232 are each formed in a rod shape having a certain radius.

The first lifter member 231 is accommodated in the first through-hole 221 and is movable in an axial direction of the first through-hole 221, that is, in a vertical direction.

The second lifter member 232 is accommodated in the second through-hole 222 and is movable in the axial direction of the first through-hole 221, that is, in the vertical direction. Furthermore, in a state in which an end portion of the second lifter member 232 at a side of the third surface 213 is slidable, the second lifter member 232 comes into contact with the first lifter member 231.

In addition, in the present example, a lifting mechanism 116a for the lifter 107a for the edge ring E elevates the second lifter member 232. The lifting mechanism 116a includes a driving unit 118a which generates a driving force for elevating the second lifter member 232 and elevates the second lifter member 232 to elevate the first lifter member 231. The driving unit 118a includes, for example, a motor (not shown) as a driving source for generating the driving force.

When the lifter 107a and the insertion hole 119a are used, for example, the first through-hole 221 is formed such that a portion thereof at a side of the second surface 212 is larger than a portion thereof at a side of the first surface 211.

In the present example, when the first through-hole 221 and the second through-hole 222 are misaligned due to a difference in temperature or thermal expansion coefficient between the electrostatic chuck 201 and the lower electrode 202, the first lifter member 231 is moved together with the first through-hole 221. Therefore, when the first through-hole 221 and the second through-hole 222 are misaligned, it is possible to prevent the lifter 107a from being damaged.

In addition, in the present example, even when the first through-hole 221 and the second through-hole 222 are misaligned, in order to allow the first lifter member 231 to be elevated according to the elevation of the second lifter member 232, the entirety of the first through-hole 221 is not formed to be large, but only a portion of the first through-hole 221 at a side of the second surface 212 is formed to be larger (than a portion thereof at a side of the first surface 211). Therefore, since a gap between the lifter 107a and a portion of the first through-hole 221 at a side of the second surface 212 is small, it is possible to prevent abnormal electrical discharge from occurring in the gap when plasma processing is performed.

In addition, instead of or in addition to forming a portion of the first through-hole 221 at a side of the second surface 212 to be larger than a portion thereof at a side of the first surface 211, the above effect may be obtained by forming a portion of the second through-hole 222 at a side of the third surface 213 to be larger than a portion thereof at a side of the fourth surface 214.

That is, when the lifter 107a and the insertion hole 119a are used, in at least one of the first through-hole 221 and the second through-hole 222, a portion of the first through-hole 221 at a side of the second surface 212 is larger than a portion thereof at a side of the first surface 211, or a portion of the second through-hole 222 at a side of the third surface 213 is larger than a portion thereof at a side of the fourth surface 214.

In the above described configuration which adjusts a temperature of an electrostatic chuck 104 to a target temperature Tt for mounting at a time point at which an edge ring is transferred from a transfer mechanism 70 to a lifter, when the lifter 107a and the insertion hole 119a of the present example are used, an upper end portion of a corresponding lifter 107 can be more reliably fitted into in a concave portion E1 of an edge ring E.

<Another Example of Ring>

Figure 12:
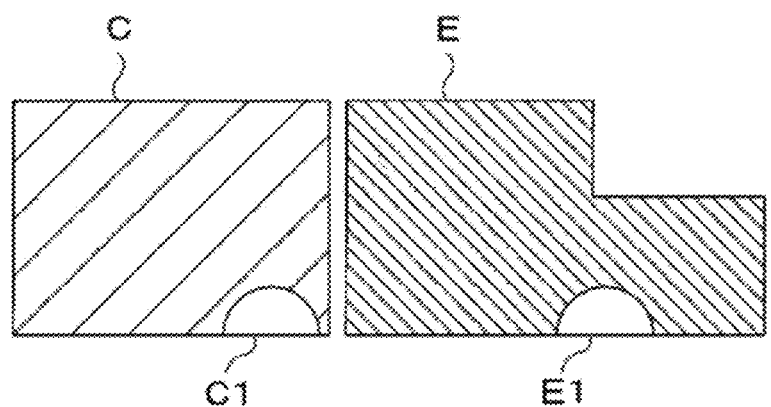
FIG. 12 is a view illustrating an example of a cover ring.

In the above example, an edge ring is a target to be replaced, but a cover ring may also be a target to be replaced. In a plan view, a cover ring is an annular member that covers a circumferential outer surface of an edge ring. When the above-described mounting process and separating process of the ring, that is, an edge ring are applied to a cover ring as a target to be replaced, as shown in FIG. 12, for example, a concave portion C1 for positioning, which has the same shape as a concave portion E1, is formed in a bottom surface of a cover ring C.

Further, only the cover ring C may be taken as a target to be replaced, and the above-described mounting process and separating process of the ring may be applied.

When the cover ring C is taken as a target to be replaced and the above-described separating process of the ring is applied, and when the cover ring C is cooled in step S12 described above, the cover ring C may be cooled through heat dissipation in a state of being supported by a lifter for the cover ring C without being mounted on a wafer support 101. The cover ring C may be mounted on the wafer support 101 to assist in cooling the cover ring C by absorbing heat from the wafer support 101.

Second Embodiment

Figure 13:
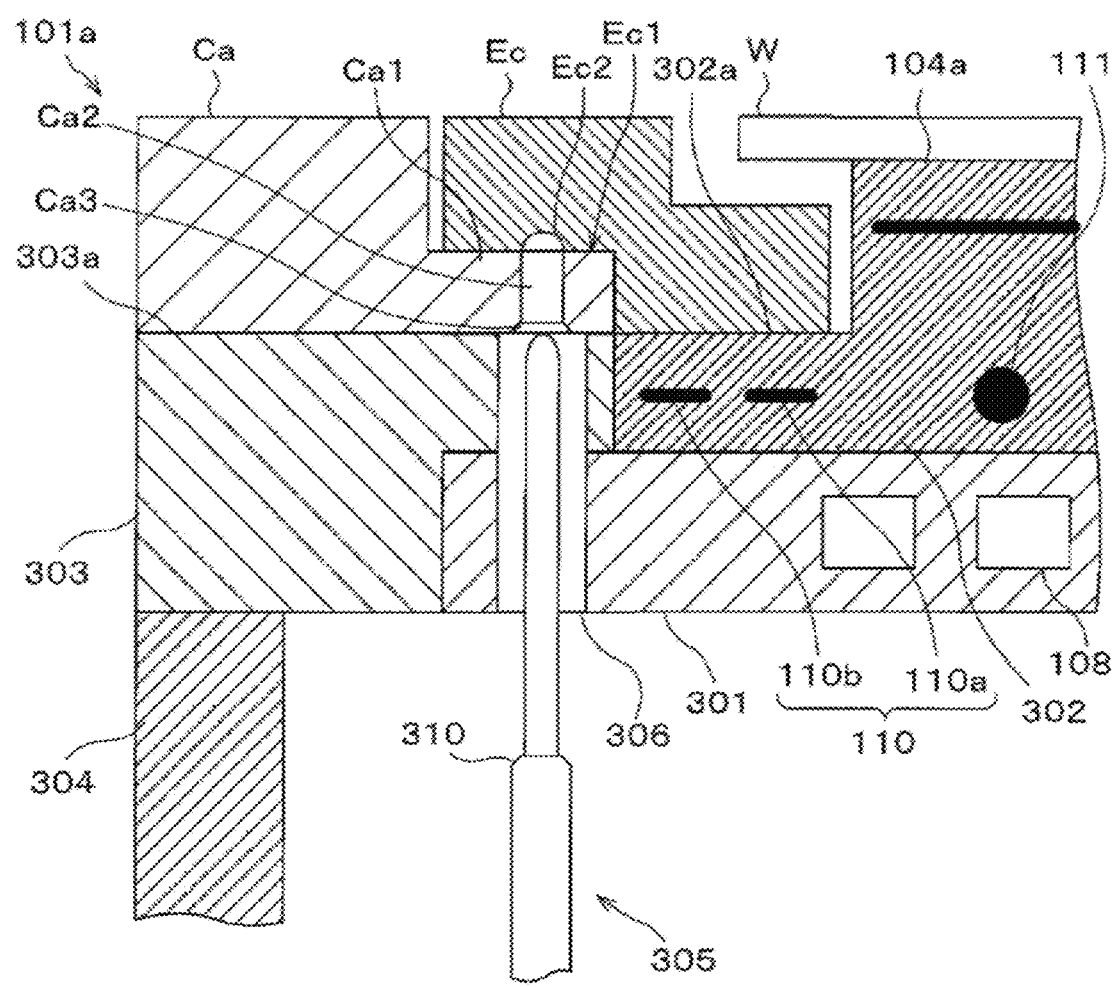
FIG. 13 is a partially enlarged cross-sectional view illustrating an outline of a configuration of a wafer support as a substrate support according to a second embodiment.

FIG. 13 is a partially enlarged cross-sectional view illustrating an outline of a configuration of a wafer support 101a as a substrate support according to a second embodiment.

In the present embodiment, both an edge ring and a cover ring are used. Furthermore, in the present embodiment, the edge ring and the cover ring may be replaced at the same time, or only the edge ring or only the cover ring may be replaced.

The wafer support 101a of FIG. 13 includes a lower electrode 301, an electrostatic chuck 302, a support 303, an insulator 304, and a lifter 305.

The support 303 is a member formed in an annular shape in a plan view using, for example, quartz, and supports the lower electrode 301 and concurrently supports a cover ring Ca. In addition, the support 303 is provided such that an upper portion thereof protrudes toward an inner peripheral side and overlaps the lower electrode 301.

The insulator 304 is a cylindrical member made of a ceramic or the like and supports the support 303. The insulator 304 is formed, for example, so as to have an outer diameter that is the same as an outer diameter of the support 303 and supports a peripheral portion of the support 303.

In the example shown in FIG. 2 and the like, an insertion hole 119 into which a lifter 107 is inserted is formed to pass through a lower electrode 103 and an electrostatic chuck 104. On the other hand, in the example of FIG. 13, an insertion hole 306 into which a lifter 305 is inserted is formed to pass through the lower electrode 301 but to not pass though the electrostatic chuck 302. Instead, the insertion hole 306 is formed to pass through an inner peripheral portion of an upper portion of the support 303. The insertion hole 306 is formed to extend in a downward direction from an upper surface 302a of a peripheral portion of the electrostatic chuck 302 to a bottom surface of the lower electrode 301. In addition, the insertion hole 306 may be formed to pass through the lower electrode 301 and the electrostatic chuck 302 as in the example of FIG. 3.

The electrostatic chuck 302 may be provided with an electrode 110 for adsorbing and holding an edge ring Ec with an electrostatic force. The electrode 110 is provided, for example, at a portion that overlaps the edge ring Ec in a plan view and does not overlap the cover ring Ca in a plan view. The electrode 110 may be provided inside the electrostatic chuck 302 or may be provided inside a dielectric that is separate from the electrostatic chuck 302.

An upper surface 104a of a central portion of the electrostatic chuck 302 serves as a substrate mounting surface on which a wafer W is mounted, and the upper surface 302a of the peripheral portion of the electrostatic chuck 302 and an upper surface 303a of the support 303 serve as ring mounting surfaces on which the edge ring Ec and the cover ring Ca are mounted.

In the present embodiment, the cover ring Ca is configured to be able to support the edge ring Ec and is formed to at least partially overlap the edge ring Ec in a plan view when being concentric with the edge ring Ec. In one embodiment, when a diameter of an innermost peripheral portion of the cover ring Ca is less than a diameter of an outermost peripheral portion of the edge ring Ec, and the cover ring Ca and the edge ring Ec are disposed to overlap over an entire circumference, in a plan view, an inner peripheral portion of the cover ring Ca at least partially overlaps the outer peripheral portion of the edge ring Ec. For example, in one embodiment, the edge ring Ec has a concave portion Ec1 that is concave inward in a radial direction thereof at an outer peripheral portion of a bottom portion thereof, and the cover ring Ca has a convex portion Ca1 that protrudes radially inward at a bottom portion thereof. The convex portion Ca1 and the concave portion Ec1 engage with each other to support the edge ring Ec.

In a bottom surface of the outer peripheral portion of the edge ring Ec, a concave portion Ec2 for positioning, into which an upper end portion of the lifter 305 is fitted, is formed for each lifter 305. The concave portion Ec2 is formed in a portion overlapping the inner peripheral portion (specifically, for example, the convex portion Ca1) of the cover ring Ca in a plan view.

In the cover ring Ca, a through-hole Ca2, which extends to the concave portion Ec2 of the edge ring Ec and into which the lifter 305 is inserted, is formed for each lifter 305. The through-hole Ca2 is formed in the inner peripheral portion (specifically, for example, the convex portion Ca1) of the cover ring Ca which overlaps the outer peripheral portion of the edge ring Ec in a plan view.

The lifter 305 is elevated to pass through the upper surface 303a of an inner peripheral portion of the support 303. When the lifter 305 is lifted, an upper end portion thereof protrudes from the upper surface 303a of the inner peripheral portion of the support 303, and specifically, the lifter 305 protrudes from a position of the upper surface 303a which overlaps the edge ring Ec and the cover ring Ca in a plan view. The insertion hole 306 into which the lifter 305 is inserted is formed at a position which overlaps the edge ring Ec and the cover ring Ca in a plan view.

Similar to the lifter 107 shown in FIG. 2 and the like, three or more lifters 305 are provided at intervals in a circumferential direction of the electrostatic chuck 302.

The upper end portion of the lifter 305 comes into contact with a bottom surface of the edge ring Ec and constitutes an edge ring support portion which supports the edge ring Ec. When the lifter 305 is lifted, the upper end portion thereof passes through the through-hole Ca2 of the cover ring Ca and comes into contact with the bottom surface of the edge ring Ec and thus is configured to support the edge ring Ec from the bottom surface thereof.

Even in the present embodiment, the concave portion Ec2 of the edge ring Ec and the upper end portion of the lifter 305 are formed such that, when the upper end portion of the corresponding lifter 305 is fitted into one concave portion Ec2 of the edge ring Ec, the edge ring Ec is positioned with respect to the lifter 305 due to the dead load of the edge ring Ec or the like.

In addition, the lifter 305 includes a cover ring support portion 310 for supporting the cover ring Ca below the upper end portion thereof constituting the edge ring support portion. The cover ring support portion 310 comes into contact with a bottom surface of the cover ring Ca without passing through the through-hole Ca2 of the cover ring Ca, thereby supporting the cover ring Ca from the bottom surface thereof.

In addition, a lower end portion of the through-hole Ca2 of the cover ring Ca constitutes a concave portion Ca3 for positioning into which the cover ring support portion 310 of the lifter 305 is fitted.

The cover ring support portion 310 and the concave portion Ca3 are formed such that, when the cover ring support portion 310 of the corresponding lifter 305 is fitted into one concave portion Ca3 of the cover ring Ca, the cover ring Ca is positioned with respect to the lifter 305 due to the dead load of the cover ring Ca or the like. Specifically, for example, a chamfering process may be performed around a lower portion of the through-hole Ca2 of the cover ring Ca to form the concave portion Ca3, and an upper end portion of the cover ring support portion 310 may be formed in a tapered shape corresponding to the chamfering process. Due to the cover ring support portion 310 and the concave portion Ca3, for example, the cover ring Ca may be positioned with respect to the lifter 305 at a position at which a center of the through-hole Ca2 and a center of the cover ring support portion 310 coincide with each other in a plan view.

Furthermore, in the present embodiment, the lower electrode 301, the electrostatic chuck 302, and the support 303 constitute a support unit including the above-described substrate mounting surface and ring mounting surface.

Figure 14:
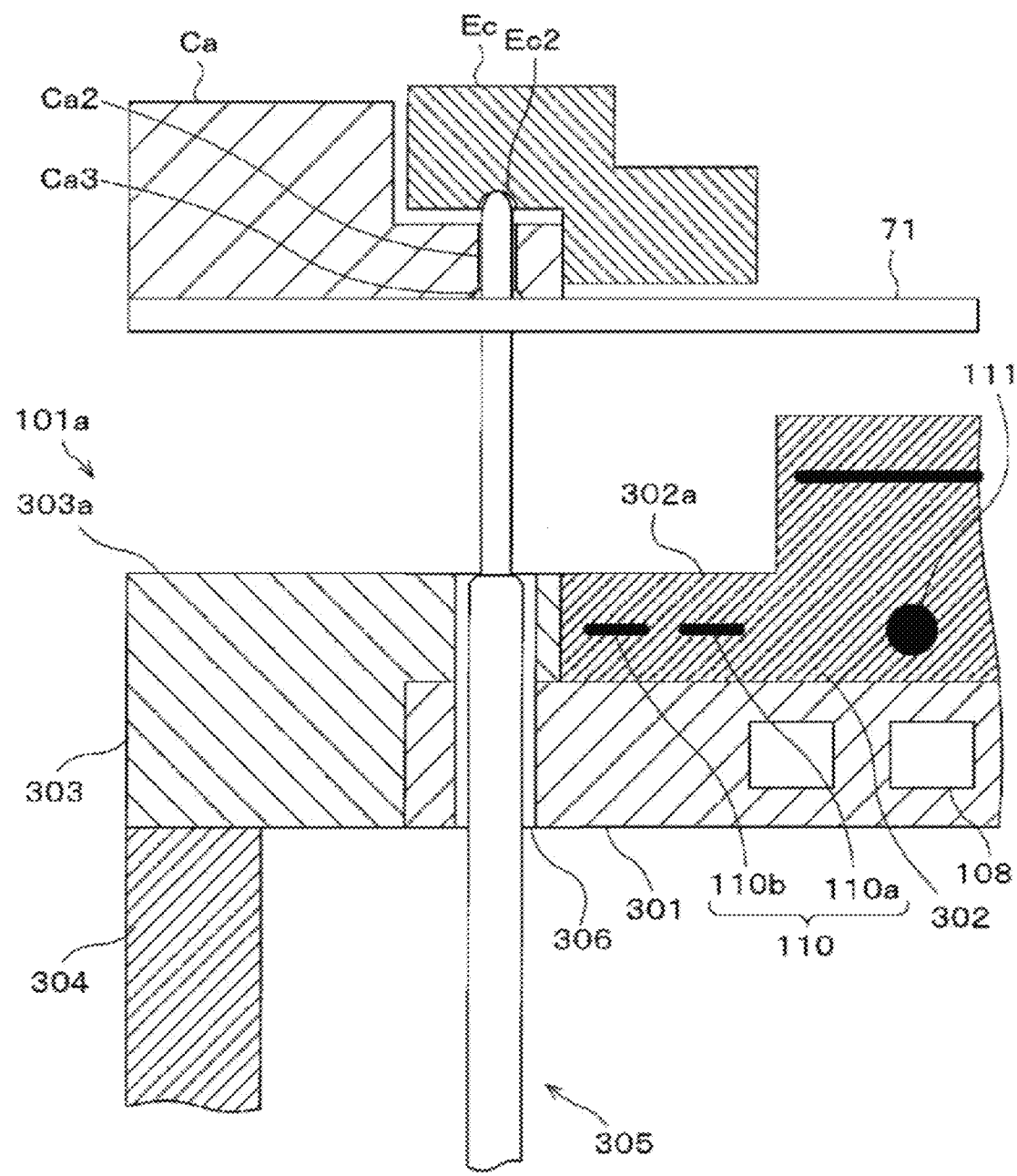
FIG. 14 is a view illustrating a state inside a plasma processing chamber during a process of concurrently mounting an edge ring and a cover ring on the wafer support of FIG. 13.
Figure 15:
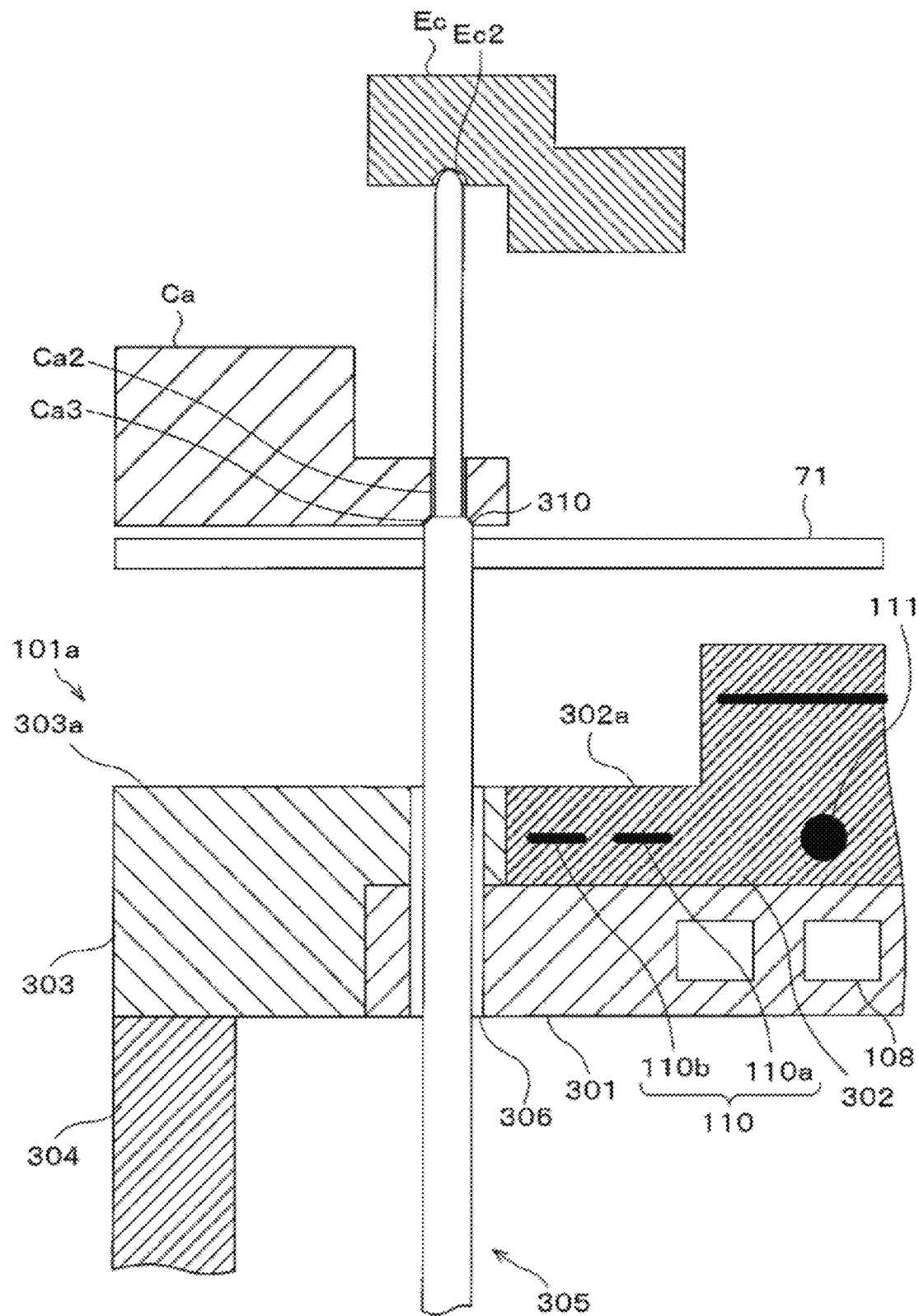
FIG. 15 is a view illustrating a state inside the plasma processing chamber during a process of concurrently mounting the edge ring and the cover ring on the wafer support of FIG. 13.

Next, it is assumed that the processing module 60 of the plasma processing system 1 of FIG. 1 includes the wafer support 101a and the accommodation module 61 accommodates the cover ring Ca supporting the edge ring Ec, and an example of a mounting process of concurrently mounting the edge ring Ec and the cover ring Ca on the wafer support 101a will be described. FIGS. 14 and 15 are views illustrating a state inside a plasma processing chamber 100 during the mounting process. In addition, the following process is performed under control of a controler 80.

(Step S21: Carry-Out and Transfer of Edge Ring Ec and Cover Ring Ca)

First, the cover ring Ca supporting the edge ring Ec is carried out of the accommodation module 61, and the cover ring Ca is transferred above the above-described ring mounting surface of the wafer support 101a included in the processing module 60 which is a mounting target for the edge ring Ec and the cover ring Ca.

Specifically, for example, a transfer arm 71 of a transfer mechanism 70 is inserted into the accommodation module 61, and the cover ring Ca supporting the edge ring Ec is held by the transfer arm 71. Next, the transfer arm 71, which holds the cover ring Ca supporting the edge ring Ec, is drawn out of the accommodation module 61. Subsequently, the transfer arm 71, which holds the cover ring Ca supporting the edge ring Ec, is inserted into the depressurized plasma processing chamber 100 included in the processing module 60, which is the mounting target, through a carry-in/out port (not shown). The transfer arm 71 transfers the cover ring Ca supporting the edge ring Ec above the above-described ring mounting surface of the wafer support 101a (specifically, the upper surface 302a of the peripheral portion of the electrostatic chuck 302 and the upper surface 303a of the support 303).

(Step S22: Temperature Adjustment of Electrostatic Chuck 302)

In addition, in the processing module 60 which is the mounting target for the edge ring Ec and the cover ring Ca, a temperature of the electrostatic chuck 302 is adjusted to a preset target temperature Tta for mounting. The target temperature Tta for mounting is a temperature at which a position of each concave portion Ec2 of the edge ring Ec matches positions of the corresponding lifter 305 (upper end portion thereof) and insertion hole 306 and a position of each concave portion Ca3 of the cover ring Ca also matches positions of (the cover ring support portion 310 of) the corresponding lifter 305 and insertion hole 306.

In the present step S22, specifically, for example, in the processing module 60 which is the mounting target, the temperature of the electrostatic chuck 302 is adjusted to the target temperature Tta for mounting by at least one of a temperature adjustment mechanism including a flow path 108 and a temperature adjustment mechanism including a heater 111.

The preset target temperature Tta for mounting is set in the same manner as the target temperature Tt for mounting described above.

(Step S23: Receiving and Mounting of Edge Ring Ec and Cover Ring Ca)

Next, the cover ring Ca supporting the edge ring Ec is received by the lifter 305 protruding from the ring mounting surface of the wafer support 101a including the electrostatic chuck 302 of which the temperature is adjusted to the target temperature Tta for mounting, and the cover ring Ca supporting the edge ring Ec is mounted on the ring mounting surface of the wafer support 101a.

Specifically, all the lifters 305 are lifted, and each lifter 305 protrudes from the ring mounting surface of the wafer support 101*a* including the electrostatic chuck 302 of which the temperature is adjusted to the target temperature Tta for mounting. As a result, the upper end portion of each lifter 305 passes through the through-hole Ca2 of the cover ring Ca held by the transfer arm 71 and comes into contact with the bottom surface of the edge ring Ec. In this case, since the temperature of the electrostatic chuck 302 is adjusted in step S22, the upper end portion of the lifter 305 is fitted into the concave portion Ec2 of the edge ring Ec.

After that, all the lifters 305 continue to be lifted, and as shown in FIG. 14, the edge ring Ec is transferred from the cover ring Ca held by the transfer arm 71 to the upper end portion of the lifter 305. In this case, the edge ring Ec is positioned with respect to the lifter 305 due to shapes of the concave portion Ec2 of the edge ring Ec and the upper end portion of the lifter 305.

In addition, after that, all the lifters 305 continue to be lifted, and as shown in FIG. 15, the cover ring Ca is transferred from the transfer arm 71 to the cover ring support portion 310 of the lifter 305. In this case, since the temperature of the electrostatic chuck 302 is adjusted in step S22, the cover ring support portion 310 of the lifter 305 is surely fitted into the concave portion Ca3 of the cover ring Ca. In addition, since the cover ring support portion 310 is fitted into the concave portion Ca3 as described above, the cover ring Ca is positioned with respect to the lifter 305 due to shapes of the concave portion Ca3 of the cover ring Ca and the cover ring support portion 310 of the lifter 305.

After the cover ring Ca is received by the lifter 305, the transfer arm 71 is drawn out of the plasma processing chamber 100. In addition, all the lifters 305 are lowered, and thus, the edge ring Ec and the cover ring Ca are mounted on the ring mounting surface of the wafer support 101*a*.

(Step S24: Adsorbing and Mounting of Edge Ring Ec)

Subsequently, the edge ring Ec is adsorbed and held on the upper surface 302*a* of the peripheral portion of the electrostatic chuck 302.

Specifically, a DC voltage from a DC power source (not shown) is applied to the electrode 110 provided at the peripheral portion of the electrostatic chuck 302, and due to an electrostatic force generated by the DC voltage, the edge ring Ec is adsorbed and held on the upper surface 302*a* of the peripheral portion of the electrostatic chuck 302.

(Step S25: Temperature Adjustment of Electrostatic Chuck 302)

After that, the temperature of the electrostatic chuck 302 of the wafer support 101*a* on which the edge ring Ec and the cover ring Ca are mounted is adjusted to a plasma processing start temperature Ts in the processing module 60 which is the mounting target.

Specifically, for example, in the processing module 60 which is the mounting target, the temperature of the electrostatic chuck 302 is adjusted to the plasma processing start temperature Ts by at least one of the temperature adjustment mechanism including the flow path 108 and the temperature adjustment mechanism including the heater 111.

As a result, a series of processes of concurrently mounting the edge ring Ec and the cover ring Ca is completed.

A process of concurrently separating the edge ring Ec and the cover ring Ca is performed in the reverse order of the above-described mounting process.

According to the above mounting process, irrespective of temperatures of the electrostatic chuck 302 and the support 303 at the start of the mounting process of concurrently mounting the edge ring Ec and the cover ring Ca, when the edge ring Ec and the cover ring Ca are supported by the lifter 305, the edge ring Ec and the cover ring Ca may be positioned with respect to the lifter 305. Therefore, irrespective of the temperatures of the electrostatic chuck 302 and the support 303 at the start of the mounting process of the edge ring Ec and the cover ring Ca, the edge ring Ec and the cover ring Ca are concurrently and appropriately positioned with respect to the electrostatic chuck 302 and mounted on the ring mounting surface of the wafer support 101*a*.

In addition, although the description is omitted, by adopting the wafer support 101*a*, an edge ring Ec unit or a cover ring Ca unit can be replaced. In addition, when mounted through the replacement, an edge ring Ec unit or a cover ring Ca unit can be mounted by being appropriately positioned with respect to the wafer support 101*a*.

In each of the above embodiments, although the edge ring is electrostatically adsorbed on the wafer support, the edge ring may not be electrostatically adsorbed.

Although various exemplary embodiments have been described above, various additions, omissions, substitutions, and changes may be made without being limited to the above-described exemplary embodiments. In addition, elements in different embodiments may be combined to form other embodiments.

The invention claimed is:

1. A plasma processing system comprising: a plasma processing apparatus configured to perform plasma processing on a substrate; a transfer apparatus connected to the plasma processing apparatus; and a controller, wherein: the plasma processing apparatus includes a substrate support which includes a support unit having a substrate mounting surface on which the substrate is mounted and an annular member mounting surface on which an annular member disposed to surround the substrate is mounted; the substrate support includes a plurality of insertion holes which pass through the annular member mounting surface and are formed in the support unit, lifters which are provided in the insertion holes and are elevated to protrude from the annular member mounting surface, an elevating mechanism which elevates the lifters, and a temperature adjustment mechanism which adjusts a temperature of the support unit; the transfer apparatus includes a transfer mechanism configured to transfer the annular member to the substrate support; concave portions, into which upper end portions of the lifters are fitted, are formed in a bottom surface of the annular member so as to be recessed upward; and the controller is configured to control the elevating mechanism, the temperature adjustment mechanism, and the transfer mechanism to perform a process of adjusting the temperature of the support unit to a preset temperature at which a position of each of the concave portions of the annular member matches positions of the corresponding lifter and insertion hole and a process of transferring the annular member above the support unit, receiving the annular member with the lifter protruding from the annular member mounting surface of the support unit of which the temperature is adjusted to the preset temperature, and mounting the annular member on the annular member mounting surface.

2. The plasma processing system of claim 1, wherein the controller is configured to control the temperature adjustment mechanism to, before the plasma processing is started and after the annular member is mounted on the annular member mounting surface, perform the process of adjusting the temperature of the support unit to a preset plasma processing start temperature.

3. The plasma processing system of claim 2, wherein: the substrate support includes an electrode configured to adsorb and hold the annular member on the support unit with an electrostatic force; and the controller is configured to control a voltage applied to the electrode to, before the process of adjusting the temperature of the support unit to the preset plasma processing start temperature, perform a process of adsorbing and holding the annular member on the support unit.

4. The plasma processing system of claim 1, wherein the controller is configured to control the elevating mechanism and the transfer mechanism to perform a process of separating the annular member from the annular member mounting surface and carrying the annular member out of the plasma processing apparatus.

5. The plasma processing system of claim 4, wherein: the plasma processing apparatus is configured to perform a removal process of removing a reaction product attached to the annular member during the plasma processing; and the controller is configured to control the plasma processing apparatus to, before the process of the carrying-out, perform a process of performing the removal process.

6. The plasma processing system of claim 5, wherein the controller is configured to control the temperature adjustment mechanism to, before the process of the carrying-out and after the process of performing the removal process, perform a process of cooling the annular member.

7. The plasma processing system of claim 1, wherein the preset temperature is set in a range of 40° C. to 80° C.

8. The plasma processing system of claim 1, wherein the preset temperature is set in a range of ±10° C. with reference to the preset plasma processing start temperature.

9. The plasma processing system of claim 1, wherein: the transfer mechanism includes another temperature adjustment mechanism configured to adjust a temperature of the annular member; and the controller is configured to control the another temperature adjustment mechanism to mount the annular member, of which the temperature is adjusted to a temperature corresponding to the preset temperature, on the annular member mounting surface in the process of mounting the annular member on the annular member mounting surface.

10. The plasma processing system of claim 2, wherein: the transfer mechanism includes another temperature adjustment mechanism configured to adjust a temperature of the annular member; and the controller is configured to control the another temperature adjustment mechanism to mount the annular member, of which the temperature is adjusted to a temperature corresponding to the preset temperature, on the annular member mounting surface in the process of mounting the annular member on the annular member mounting surface.

11. The plasma processing system of claim 1, wherein:
the support unit includes a first member which has a first surface as the annular member mounting surface and a second surface as a rear surface of the first surface and has a first through-hole passing through the first surface and the second surface, and a second member which is disposed to overlap the second surface of the first member, has a third surface in contact with the second surface and a fourth surface as a rear surface of the third surface, and has a second through-hole which passes through the third surface and the fourth surface so as to correspond to a position of the first through-hole and communicates with the first through-hole;
the insertion hole is formed of the first through-hole and the second through-hole;
the lifters include a first lifter member which is accommodated in the first through-hole and is movable in an axial direction of the first through-hole, and a second lifter member which is accommodated in the second through-hole, is movable in the axial direction, and comes into contact with the first lifter member in a state in which an end portion of the second lifter member at a side of the third surface is slidable;
the elevating mechanism elevates the second lifter member; and
in at least one of the first through-hole and the second through-hole, a portion of the first through-hole at a side of the second surface is larger than a portion thereof at a side of the first surface, or a portion of the second through-hole at a side of the third surface is larger than a portion thereof at a side of the fourth surface.

12. The plasma processing system of claim 2, wherein:
the support unit includes a first member which has a first surface as the annular member mounting surface and a second surface as a rear surface of the first surface and has a first through-hole passing through the first surface and the second surface, and a second member which is disposed to overlap the second surface of the first member, has a third surface in contact with the second surface and a fourth surface as a rear surface of the third surface, and has a second through-hole which passes through the third surface and the fourth surface so as to correspond to a position of the first through-hole and communicates with the first through-hole;
the insertion hole is formed of the first through-hole and the second through-hole;
the lifters include a first lifter member which is accommodated in the first through-hole and is movable in an axial direction of the first through-hole, and a second lifter member which is accommodated in the second through-hole, is movable in the axial direction, and comes into contact with the first lifter member in a state in which an end portion of the second lifter member at a side of the third surface is slidable;
the elevating mechanism elevates the second lifter member; and
in at least one of the first through-hole and the second through-hole, a portion of the first through-hole at a side of the second surface is larger than a portion thereof at a side of the first surface, or a portion of the second through-hole at a side of the third surface is larger than a portion thereof at a side of the fourth surface.

13. The plasma processing system of claim 1, wherein the annular member includes at least one of an edge ring disposed adjacent to the substrate mounted on the substrate mounting surface and a cover ring configured to cover an outer surface of the edge ring.

14. The plasma processing system of claim 2, wherein the annular member includes at least one of an edge ring disposed adjacent to the substrate mounted on the substrate mounting surface and a cover ring configured to cover an outer surface of the edge ring.

15. The plasma processing system of claim 13, wherein:
the annular member includes both the edge ring and the cover ring;
among the edge ring and the cover ring, the edge ring has the concave portions formed in a bottom surface thereof, and the cover ring has through-holes, into which the lifters are inserted, extending to the concave portion of the edge ring;
the lifter includes an edge ring support portion engaged with the concave portion of the edge ring to support the edge ring at an upper end portion thereof and includes a cover ring support portion configured to support the cover ring below the edge ring support portion; and lower end portions of the through-holes constitute other concave portions into which the cover ring support portion is fitted.

16. The plasma processing system of claim 14, wherein:

the annular member includes both the edge ring and the cover ring;

among the edge ring and the cover ring, the edge ring has the concave portions formed in a bottom surface thereof, and the cover ring has through-holes, into which the lifters are inserted, extending to the concave portion of the edge ring;

the lifter includes an edge ring support portion engaged with the concave portion of the edge ring to support the edge ring at an upper end portion thereof and includes a cover ring support portion configured to support the cover ring below the edge ring support portion; and lower end portions of the through-holes constitute other concave portions into which the cover ring support portion is fitted.

17. The plasma processing system of claim 15, wherein the preset temperature is a temperature at which the position of each of the concave portions of the edge ring matches the positions of a corresponding one of the lifters and a corresponding one of the insertion holes and a position of each of the other concave portions of the cover ring also matches positions of a corresponding one of the lifters and a corresponding one of the insertion holes.

18. The plasma processing system of claim 16, wherein the preset temperature is a temperature at which the position of each of the concave portions of the edge ring matches the positions of a corresponding one of the lifters and a corresponding one of the insertion holes and a position of each of the other concave portions of the cover ring also matches positions of a corresponding one of the lifters and a corresponding one of the insertion holes.

* * * * *